(12) United States Patent
Yano et al.

(10) Patent No.: US 9,069,012 B2
(45) Date of Patent: Jun. 30, 2015

(54) CONNECTION TERMINAL AND CONNECTION JIG

(75) Inventors: Akihiro Yano, Kyoto (JP); Norihiro Ohta, Kyoto (JP); Satoshi Furukawa, Kyoto (JP); Masami Yamamoto, Kyoto (JP); Yusuke Yokota, Kyoto (JP)

(73) Assignee: NIDEC-READ CORPORATION, Kyoto (JP)

( * ) Notice: Subject to any disclaimer, the term of this patent is extended or adjusted under 35 U.S.C. 154(b) by 374 days.

(21) Appl. No.: 13/601,982

(22) Filed: Aug. 31, 2012

(65) Prior Publication Data

US 2013/0057308 A1 Mar. 7, 2013

(30) Foreign Application Priority Data

Sep. 5, 2011 (JP) .................. 2011-192422

(51) Int. Cl.
*H01R 13/24* (2006.01)
*G01R 1/067* (2006.01)
*G01R 1/073* (2006.01)
*G01R 3/00* (2006.01)
*H01R 13/08* (2006.01)
*H01R 43/16* (2006.01)

(52) U.S. Cl.
CPC ....... *G01R 1/06722* (2013.01); *Y10T 29/49208* (2015.01); *G01R 1/06738* (2013.01); *G01R 1/07314* (2013.01); *H01R 13/08* (2013.01); *H01R 43/16* (2013.01); *H01R 2201/20* (2013.01); *G01R 3/00* (2013.01)

(58) Field of Classification Search
CPC .................. H01R 13/2421; H01R 13/2442

USPC ............... 439/700, 862, 824, 289, 88
See application file for complete search history.

(56) References Cited

FOREIGN PATENT DOCUMENTS

| | | |
|---|---|---|
| CN | 101907642 A | 12/2010 |
| JP | 62-225960 A | 10/1987 |
| JP | 2004-115838 | 4/2004 |
| JP | 2005-069805 A | 3/2005 |
| JP | 4031007 | 10/2007 |
| JP | 2008-25833 | 2/2008 |
| JP | 2009-160722 | 7/2009 |
| JP | 4572303 | 8/2010 |
| JP | 2011-089918 A | 5/2011 |

OTHER PUBLICATIONS

Office Action issued by the Japan Patent Office on Apr. 27, 2015 for patent application No. JP2011-192422.

*Primary Examiner* — Phuongchi T Nguyen
(74) *Attorney, Agent, or Firm* — Konomi Takeshita

(57) ABSTRACT

Provided is a connection terminal that maintains an approximately circular shape before or after a cylindrical part is fixed by resistance welding. The connection terminal used for a connection jig interconnecting target points includes a small-diameter conductive part and a large-diameter cylindrical part disposed to surround the small-diameter conductive part. The small-diameter conductive part has a front end protruding from a front end of the large-diameter cylindrical part. A part of the small-diameter conductive part is joined to a part of the large-diameter cylindrical part. A cutout part is formed in a part of a strip portion around an axis of the cylindrical part that at least includes the portion of the large-diameter cylindrical part which is joined to the small-diameter conductive part.

13 Claims, 16 Drawing Sheets

CONNECTION TERMINAL AND CONNECTION JIG

CROSS REFERENCE TO RELATED APPLICATIONS

This application claims priority under 35 U.S.C. 119 based upon Japanese Patent Application Serial No. 2011-192422, filed on Sep. 5, 2011. The entire disclosures of the aforesaid applications are incorporated herein by reference.

FIELD OF THE INVENTION

The present invention relates to a connection jig electrically connecting a test device and a target point preset with a target and a connection terminal having an insulating coating used for the connection jig. Here, the connection terminal of the present invention is not limited to the test device used as a connection target, and it can also be used to form an electrical connection between other two given points.

BACKGROUND OF THE INVENTION

Such a connection jig is equipped with a connection terminal (a contact, a probe, an explorer, or a contact pin), supplies electric current or an electrical signal to a preset target point of a target from a test device, and detects an electrical signal from the target point, thereby detecting electrical characteristics existing between the target points so as to carry out an operation test of a continuity test or a leak test.

The target may be, for example, a variety of boards such as a printed circuit board, a flexible board, a ceramic multilayer printed circuit board, an electrode plate for a liquid crystal display or a plasma display, and a package board or film carrier for a semiconductor package, and semiconductor devices (large scale integrations (LSIs)) such as a semiconductor wafer, a semiconductor chip, and a chip size package (CSP). The connection terminal can also be directed to electrically connecting the target and the device, and furthermore be employed as the connector jig, such as an interposer or a connector, that connects an electrode terminal and an electrode terminal.

For example, when a specimen is a board on which a semiconductor circuit such as an integrated circuit (IC) or an electric/electronic part such as a resistor is mounted, the test target section formed on the board becomes a wiring or an electrode. In this case, to guarantee that the wiring which is the test target section is able to accurately transmit the electrical signal, the electrical characteristics such as the resistance between the test points existing on a printed circuit board on which the wiring is formed, a liquid crystal panel, or a plasma display panel before the electric/electronic part is mounted are measured, and then it is determined whether or not the wiring is poor.

When the connection jig is used as a test jig, a plurality of probes are provided to bring the tips thereof into contact with the test points of the test target section of the specimen and to supply electric current for measurement purposes to the test target section or to measure the voltage from the test target section.

In the present specification, the targets are collectively called a "target," and a spot which is set on the target and with which the connection terminal is put in contact with to form a state of conduction is simply called a "target point." A region sandwiched between the target point and the target point is defined as "between the target points."

When the target is an LSI, an electronic circuit formed on the LSI becomes a target section and the surface pads of the electronic circuit become respective target points. In this case, to guarantee that the electronic circuit formed on the LSI has the desired electrical characteristics, the electrical characteristics between the target points are measured, and it is determined whether or not the electronic circuit is poor.

Further, when the target is a board mounted with an electric/electronic part, wiring formed on the board becomes a target section, and opposite ends of the wiring become target points. In this case, to guarantee that the wiring which is the target section is able to accurately transmit an electrical signal, electrical characteristics such as the resistance or a leak current between given target points on the wiring formed on a circuit board before the electric/electronic part is mounted are measured, and it is determined whether or not the wiring is poor.

In detail, whether or not the wiring is poor is determined by bringing each tip of an electric current-supplying terminal and/or the connection terminal for voltage measurement into contact with each target point, supplying electric current for measurement purposes from the connection terminal of the electric current supplying terminal to the target point and simultaneously measuring the voltage generated from the wiring between the tips of the connection terminal that is in contact with the target points, and calculating the resistance of the wiring between given target points from the supplied electric current and the measured voltage.

For example, when any one of the above boards is tested using a board test device, the connection terminal (the contact, probe, explorer, or contact pin) for testing the board connection jig is transferred to the target point of the test target board by a jig transfer unit, and is brought into contact with the target point, and a given test is performed on the target. When the test is completed, the jig is transferred from the target point to a standby position by the jig transfer unit. In this way, the board that is tested is controlled.

Japanese Patent No. 4572303 (Patent Document 1) discloses a contact for a conducting test jig in which a conductive pin is inserted into a nickel (Ni) electroformed pipe having a spiral structure portion, and is fixed in the Ni electroformed pipe by means such as caulking, welding, or a fusion material. Japanese Patent No. 4031007 (Patent Document 2) discloses a coil spring probe in which a contact pin formed of a linear contact and guide is provided in a cylinder whose peripheral wall is partially formed into a spring, and a collar is formed between the contact and the guide, and is connected to a lower end of the cylinder.

Japanese Unexamined Patent Application Publication No. 2004-115838 (Patent Document 3) discloses a method of manufacturing a nickel electroformed pipe by forming a gold-plated layer on an outer circumferential surface of a linear material, further forming a nickel plated layer on the gold-plated layer, drawing the linear material to reduce a cross-sectional area of the liner material, and removing the liner material.

Japanese Unexamined Patent Application Publication No. 2008-025833 (Patent Document 4) discloses a method of manufacturing a nickel electroformed pipe having a coil spring structure in part by forming an insulating coating on an outer circumferential surface of an SUS wire, forming a helical groove in the insulating coating using a laser to expose the outer circumferential surface of the SUS wire, forming a nickel film having the same thickness as the insulating coating in the groove, removing the insulating coating from the outer circumferential surface of the SUS wire, and drawing the SUS wire.

Japanese Unexamined Patent Application Publication No. 2009-160722 (Patent Document 5) discloses a method of simultaneously forming a plurality of micro-coils separated by space patterns by separately manufacturing a micro-pipe, forming a resist film on an outer circumferential surface of the micro-pipe, dissolving a photosensitive portion in a helical shape by, for instance, developing the film to form helical space patterns on the resist film, forming space patterns going around the micro-pipe at given intervals, and etching the space patterns.

SUMMARY OF THE INVENTION

As in Patent Document 1, when the conductive pin is inserted into the Ni electroformed pipe and is fixed in the Ni electroformed pipe by means such as caulking, welding, or a fusion material, a cross section of the electroformed pipe is deformed from a circular shape to an elliptical shape by the force that pinches the electroformed pipe from a facing position when doing the attaching, and a maximum outer diameter of the contact is increased. Thus, there is the danger of failing to meet the need to miniaturize the connection terminal associated with the recent complicated structure and miniaturization of the board of the test target.

In the coil spring probe of Patent Document 2, there is a need to form the collar between the contact and the guide and to connect them to the cylinder, and thus the number of components and the number of assembly processes are increased. Further, since the spring part of the cylinder is exposed, the spring part may come into contact with a wall of a probe guide part or an insertion hole of a testing jig that does not move relative to the cylinder.

Further, recently, the process of forming the LSI has been improved, the LSI has miniaturized, and the LSI testing pad has advanced so that it is decreased in pitch and increased in number. Thus, making the board of the test target with a complicated structure and miniaturized has further progressed, and the target point set to the board is adapted to be formed in a narrower or smaller fashion. As such, the connection terminal is formed to be finer. For this reason, there is a need to manufacture numerous fine connection terminals in a more efficient way.

Further, to prevent the adjacently disposed connection terminals from being shorted by making contact with each other, an insulating film is preferably formed on a surface of each connection terminal. However, the finer the connection terminal becomes, the more difficult it is to form the insulating film.

In Patent Documents 3 and 4, the method of manufacturing the fine nickel electroformed pipe or the nickel electroformed pipe having the coil spring structure in part in the process in which the linear material or the SUS wire are removed is disclosed. However, to manufacture the connection terminal attached to the connection jig from the manufactured nickel electroformed pipe, an additional process of, for instance, cutting the pipe at a length suitable for the connection terminal or forming a locking part locked on the connection jig, is still required.

Further, Patent Document 5 discloses a method of manufacturing the micro-coil by conducting an additional process after the micro-pipe as shown in, for instance, has been manufactured according to Patent Document 3. To manufacture the connection terminal attached to the connection jig from the micro-coil, the additional process described above in connection with Patent Documents 3 and 4 is still required.

Accordingly, an objective of the present invention is to provide a connection terminal, which is manufactured by applying force from at least facing positions of an outer side of a cylindrical part toward an internal columnar part, and joining the cylindrical part and the columnar part like electric welding, and in which the cylindrical part maintains an approximately circular shape (or an original shape) before or after being fixed.

Another objective of the present invention is to provide a probe having a small number of components.

Another objective of the present invention is to provide a probe that is easily assembled.

Another objective of the present invention is to provide a method of manufacturing a connection terminal, capable of forming a cutout part in a process of removing a linear material or an SUS wire, without a need for an additional process.

Here, a connection terminal used for a connection jig interconnecting target points includes a small-diameter conductive part and a large-diameter cylindrical part disposed to surround the small-diameter conductive part. The small-diameter conductive part has a front end protruding from a front end of the large-diameter cylindrical part. A part of the small-diameter conductive part is joined to a part of the large-diameter cylindrical part. A cutout part is formed in a part of a strip portion around an axis of the cylindrical part that at least includes the portion of the large-diameter cylindrical part which is joined to the small-diameter conductive part.

In the connection terminal, the cutout part may have an axial length as the cylindrical part and a widthwise length along a circumferential surface of the strip portion around the axis of the cylindrical part, the axial length of the cutout part may be longer than axially opposite ends of the cylindrical part of electrodes used when the small-diameter conductive part is partly joined to the part of the large-diameter cylindrical part, or the widthwise length of the cutout part may be greater than a difference between the circumference of an inner circumferential surface of the cylindrical part and the circumference of an outer circumferential surface of the small-diameter conductive part.

In the connection terminal, the cutout part may be formed in a direction in line with the axis of the cylindrical part or a direction intersecting a line parallel with the axis.

In the connection terminal, the cutout part may be made up of a pair of cutout parts that have line symmetry with respect to the axis of the cylindrical part.

In the connection terminal, the cutout part may have a slit shape with an elongated opening.

In the connection terminal, the length of each cutout part may be greater than the length of a line parallel with the cutout part of a portion where the part of the small-diameter conductive part is joined to the part of the large-diameter cylindrical part.

In the connection terminal, a spring part may be formed at a portion of the cylindrical part which excludes the strip part including the portion joined to the conductive part.

In the connection terminal, the small-diameter conductive part may be made up of a columnar part or a cylindrical part.

In the connection terminal, the conductive part of the small-diameter cylindrical part may have a spring part in part.

Further, a method of manufacturing a connection terminal used for a connection jig interconnecting target points includes forming a small-diameter conductive part and a large-diameter cylindrical part, forming a cutout part in a part of a strip portion around an axis of the large-diameter cylindrical part, inserting the small-diameter conductive part into the large-diameter cylindrical part leaving a front end of the small-diameter conductive part so that it protrudes from a front end of the large-diameter cylindrical part, disposing a pair of electrodes for resistance welding at positions that are opposite to each other in a direction perpendicular to an axial direction of the strip portion around the axis of the large-diameter cylindrical part and that excludes position at which the cutout part is formed, pressurizing the large-diameter cylindrical part so as to move the pair of electrodes for resistance welding toward each other and bringing the large-diameter cylindrical part into contact with the small-diameter conductive part, and applying predetermined electric current to the pair of electrodes to carry out the resistance welding, thereby joining a part of the large-diameter cylindrical part and a part of the small-diameter conductive part.

In the method, the cutout part may have an axial length of the cylindrical part and a widthwise length along a circumferential surface of the strip portion around the axis of the cylindrical part, the axial length of the cutout part may be a length exceeding axially opposite ends of the cylindrical part of the electrodes used when the small-diameter conductive part is partly joined to the part of the large-diameter cylindrical part, or the widthwise length of the cutout part may be greater than the difference between the circumference of an inner circumferential surface of the cylindrical part and the circumference of an outer circumferential surface of the small-diameter conductive part.

In the method, the cutout part may be formed in a direction in parallel with the axis of the cylindrical part or a direction intersecting the direction that is parallel with the axis.

In the method, a spring part may be formed at a portion of the cylindrical part which excludes the strip part including the portion joined to the conductive part.

In the method, the small-diameter conductive part may be made up of a columnar part or a cylindrical part.

According to the present invention, the connection terminal is manufactured by applying force from at least facing positions of an outer side of a cylindrical part toward an internal columnar part, and joining the cylindrical part and the columnar part using electric welding, for example. In this manufacturing process, the cylindrical part can maintain an approximately circular shape (or an original shape) before or after being fixed.

According to the present invention, the connection terminal and the connection jig having the cutout part can be provided and used in the process of removing a linear material or an SUS wire without there being a need for an additional process.

Furthermore, according to the present invention, a probe having a small number of components can be provided.

According to the present invention, a probe that is easy to assemble can be provided.

BRIEF DESCRIPTION OF THE DRAWINGS

The above and other objects, features and advantages of the present invention will be more clearly understood from the following detailed description taken in conjunction with the accompanying drawings, which illustrate, by way of example, the principles of the invention.

DETAILED DESCRIPTION OF THE INVENTION

A testing jig and connection terminal of the present invention supplies an electric power signal or electrical signal from a test device to a given test position in a test target section having a specimen, and detects the electrical signal from the test target section, thereby making it possible to detect electrical characteristics of the test target section or to carry out an operation test.

Examples of the specimen, for instance, include a variety of boards such as a printed circuit board, a flexible board, a ceramic multilayer printed circuit board, an electrode plate for a liquid crystal display or a plasma display, and a package board or film carrier for a semiconductor package, and a variety of semiconductor devices such as a semiconductor wafer, a semiconductor chip, and a chip size package (CSP).

Further, the connection terminal according to the present invention can also be directed to electrically connecting a target and a device and furthermore be employed as a connector jig that connects an electrode terminal and an electrode terminal such as an interposer or a connector.

In the present specification, the aforementioned specimens are collectively called a "specimen," and a test target section formed in the specimen is called a "test target section." Further, in the present specification, the targets are collectively called a "target," and a spot which is set for the target and with which the connection terminal is put in contact with to form a conducted state is simply called a "target point." A region that is sandwiched between the target point and the target point is defined as "between the target points."

Hereinafter, description will be made for the case in which the connection terminal is used as a testing probe of a test target section of a specimen of a board or a semiconductor device.

In the attached drawings, a thickness, length, and shape of each member, and an interval between the members is appropriately enlarged, contracted, deformed, and simplified for the sake of easy understanding.

[Schematic Configuration of Testing Jig]

Figure 1:
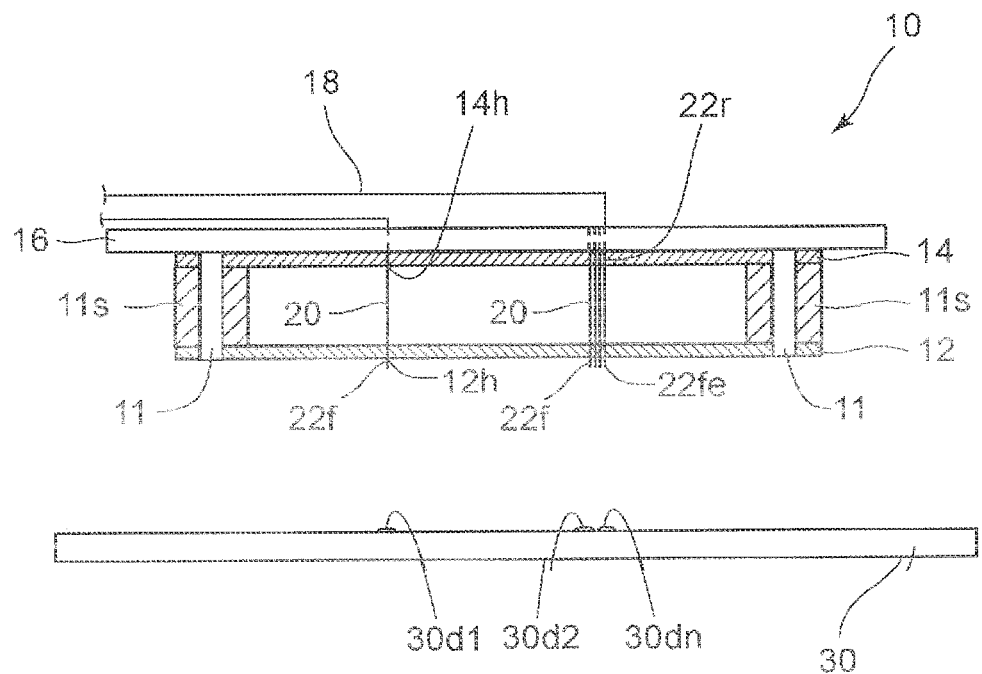
FIG. 1 is a partial cross-sectional front view showing a schematic configuration of a testing jig to which a testing probe is attached in accordance with an embodiment of the present embodiment.

FIG. 1 is a partial cross-sectional front view showing a schematic configuration of a testing jig 10 according to an embodiment of the present embodiment. The testing jig 10 includes a head part 12, a base part 14, and an electrode part 16. The head part 12 and the base part 14 are formed of an insulative planar member made of resin or ceramic. The head part 12 and the base part 14 are spaced apart and held a predetermined distance apart from each other by rod-like support members 11 and spacers 11s annularly mounted around the respective support members.

The head part 12 is provided with a plurality of through-holes 12h. A front end 22f of a probe 20 inserted into each through-hole is guided to a predetermined position. The base part 14 is provided with a plurality of through-holes 14h. A rear end 22r of the probe 20 inserted into each through-hole is guided to an electrode part 16. As the test target becomes fine, the distance between test points is very much reduced. As such, an inner diameter of each of the through-holes 12h and 14h is very much reduced as well.

The rear end 22r of the probe 20 is put in contact with an end of a conducting wire 18 fixed to the electrode part 16, and the conducting wire 18 is connected to the test device that is not shown.

In FIG. 1, to simplify the drawing, merely a part of the probe 20 is shown.

Further, as shown in FIG. 1, when the specimen is tested, the specimen 30 of the test target is disposed below the testing jig 10. The testing jig 10 is lowered to bring a front end face 22fe of the probe 20 into contact with a predetermined test point, for instance, 30dn. Thereby, the electrical characteristics of the test target section are tested.

[Structure of Connection Terminal]

Figure 2A:
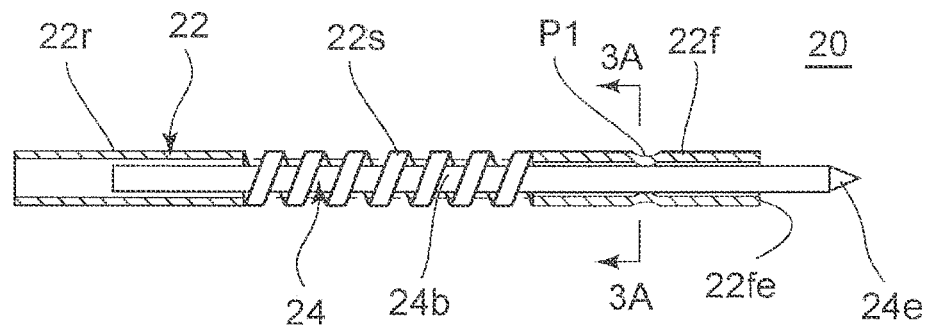
FIG. 2A shows a schematic configuration of a connection terminal that can be used in the testing jig of FIG. 1 and has a slit in accordance with the embodiment
Figure 2B:
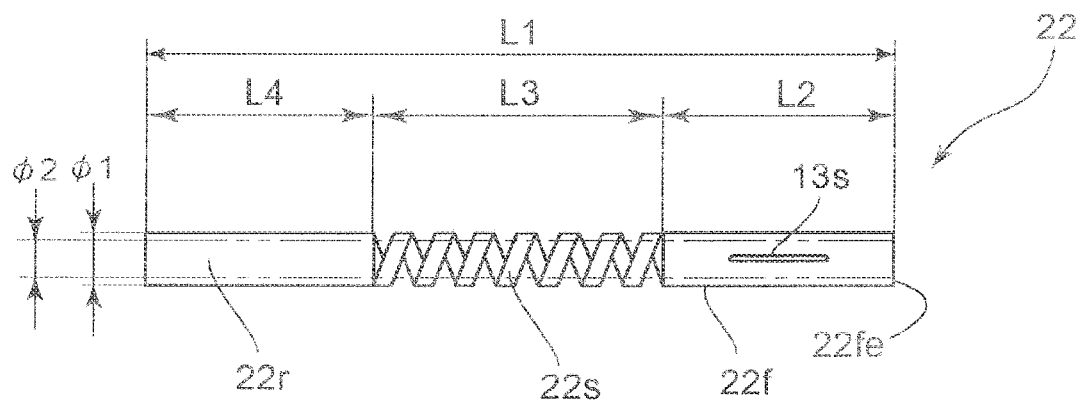
FIG. 2B is a schematic configuration view showing an example of a part of a constituent member of the connection terminal of FIG. 2A.
Figure 2C:
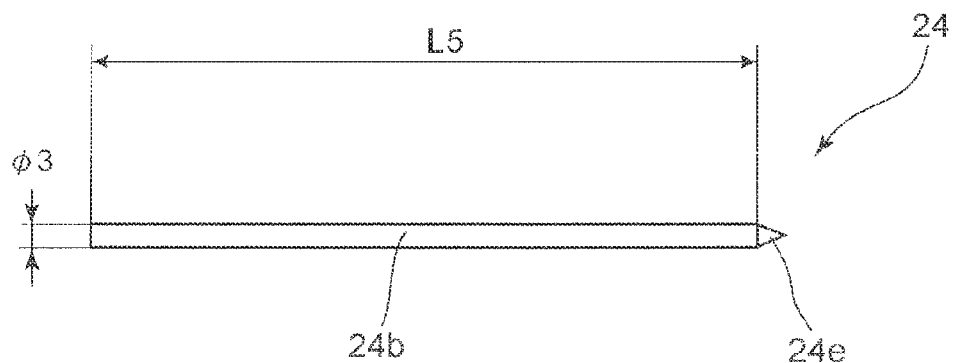
FIG. 2C is a schematic configuration view showing an example of a part of a constituent member of the connection terminal of FIG. 2A.
Figure 2D:
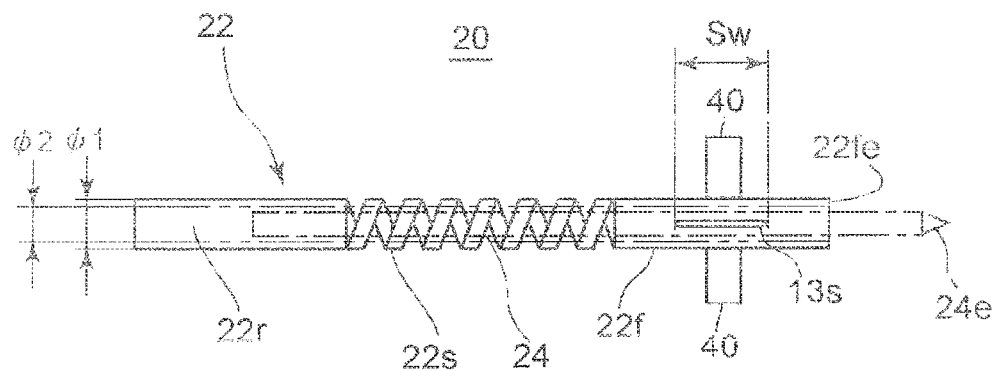
FIG. 2D is a conceptual view for describing an example of a method of manufacturing the connection terminal of FIG. 2A.

FIGS. 2A to 2D are side views enlarged and simplified to describe a connection terminal (also called a "probe") 20, which can be used in the testing jig of FIG. 1, according to the embodiment. FIG. 2A is a partial cross-sectional view of the connection terminal 20, and FIG. 2B is a side view of a cylindrical part 22 constituting the connection terminal 20. FIG. 2C is a side view of a rod-like part 24 constituting the connection terminal 20, and FIG. 2D is a side view simplified to describe a method of joining the rod-like part 24 to the cylindrical part 22.

FIG. 2A shows the connection terminal 20, which can be used in the testing jig of FIG. 1, according to the embodiment. The connection terminal 20 is made up of the conductive cylindrical part 22 and the conductive columnar rod-like part 24. The rod-like part 24 is inserted into the conductive cylindrical part 22.

The cylindrical part 22 is made up of a cylindrical front end 22f, a cylindrical rear end 22r, and a spring part 22s formed between these ends. The spring part 22s is formed in a spiral shape. The rod-like part 24 is made up of a columnar main body part 24b and an acuminate front end 24e.

The rod-like part 24 is inserted into the front end 22f, spring part 22s, and rear end 22r of the cylindrical part 22. The front end 24e of the rod-like part 24 protrudes from the front end face 22fe of the front end 22f of the cylindrical part 22. A rear end side of the rod-like part 24 is located at a position that is more retracted inside than a rear end face of the rear end 22r of the cylindrical part 22. The distance by which the rear end is retracted, i.e. the retracted position, is of such a distance that, when the front end 24e of the rod-like part 24 is pressed and retreated, the rear end side of the rod-like part 24 moving along with the front end 24e does not protrude from the rear end face of the rear end 22r of the cylindrical part 22.

When expanded or contracted, the spring part 22s pivots about its axis while it expands and contracts. That is, for example, when the rod-like part 24 is retreated by pressing the front end 24e of the rod-like part 24 in a state in which the rear end 22r of the cylindrical part 22 is fixed, the front end 22f of the cylindrical part 22 retreats along with the front end 24e of the rod-like part 24 (because both are joined at a position of P1). Along with this retreat, the spring part 22s contracts. In this case, since the rear end 22r of the cylindrical part 22 is fixed and so is unable to rotate, the front end 22f of the cylindrical part 22 is made to pivot. Due to this pivoting, the spring part 22s is allowed to maintain the same outer diameter before and after the contraction.

Further, as for the position shown by P1 of the cylindrical front end 22f, the cylindrical front end 22f and the main body part 24b of the rod-like part 24 are joined by resistance welding (electric welding) or caulking as will be described below in further detail, and thus are fixed to each other. For this reason, the cylindrical front end 22f and the columnar main body part 24b are made to move together. Further, due to the joining, the cylindrical front end 22f and the main body part 24b of the rod-like part 24 are allowed to be in electrical conduction.

FIG. 2B shows the cylindrical part 22 constituting the connection terminal 20. As the cylindrical part 22, for example, a tube of nickel or its alloy which has an outer diameter of about 25 to 300 μm and an inner diameter of about 10 to 250 μm may be used. In this embodiment, as an example, a nickel tube having an outer diameter φ1 of about 70 μm, an inner diameter φ2 of about 50 μm and a total length L1 of about 20 mm is used. However, the embodiment is not limited to the nickel tube. Except for the front end face 22fe of the front end 22f of the cylindrical part 22 and the rear end face of the rear end 22r, the circumferential surface may be imparted with an insulating coating as needed.

Further, a length L2 of the cylindrical front end 22f is about 5 mm, a length L3 of the spring part 22s is about 10 mm, and a length L4 of the rear end 22r is about 5 mm. These values are given as an example, and thus the embodiment is not limited to these values.

A slit 13s of a cutout part is formed in a longitudinal of a strip part around the axis of the cylindrical front end 22f. As shown in FIG. 2A, this slit 13s exerts a value when the cylindrical front end 22f and the main body part 24b of the rod-like part 24 are joined and fixed to each other by resistance welding or caulking. The slit 13s will be described in detail based on FIG. 2D.

Further, the cylindrical part 22 may be manufactured by, for instance, a manufacturing method shown in FIGS. 6A to 6H. In this process, the slit 13s may also be formed.

FIG. 2C shows the rod-like part 24 constituting the connection terminal 20. As the rod-like part 24, for example, a columnar member formed of tungsten, carbon steel for tools (SK material), or beryllium copper which has a diameter φ3 of about 48 μm may be used. This diameter is smaller than the inner diameter of the cylindrical part 22, because the rod-like part 24 should freely move inside the cylindrical part 22. For example, when the rod-like part 24 is inserted into the cylindrical part 22, a clearance of about 1 μm is formed between the rod-like part 24 and the cylindrical part 22. The rod-like part 24 is subjected to a change in length depending on a length by which the front end thereof protrudes from the head part 12 of the testing jig (FIG. 1). However, the length of the rod-like part 24 may be almost equal to or shorter than that of the cylindrical part 22.

Further, the front end of the rod-like part 24 may have a shape cut into one face inclinedly intersecting a longitudinal axis of a columnar part. As described above, since the spring part 22s pivots along with the expansion or contraction, when the rod-like part 24, the front end of which has such a shape, is fitted into the cylindrical part 22, for instance when the front end of the columnar part which has such a shape is pressed against a specimen and thus the spring part is contracted, the columnar part pivots around its longitudinal axis, the front end face of such a shape is allowed to move on a surface of the specimen 30 so as to scratch or scrape off an oxide film of the surface of the specimen 30.

As the shape of the front end of the rod-like part 24, in addition to the shape described above, a shape cut into two faces inclinedly intersecting the longitudinal axis of the columnar part may be used. The front end at which the two faces intersect each other forms a shape like the edge of a knife. Further, a laminated edge that is shaped like the tip of a slotted screwdriver may be used. In addition, the position of the laminated edge may deviate from the axis.

FIG. 2D is a conceptual view for describing a method of assembling the connection terminal 20. Here, the description will be made for the case in which the front end 22f of the cylindrical part 22 and the main body part 24b of the rod-like part 24 are joined using resistance welding. As shown in FIG. 2D, the slit 13s of the cutout part is formed in the middle portion of the front end 22f of the cylindrical part 22 in a longitudinal direction. Further, the same slit 13s is also formed on an opposite side located on a rear side of the drawing. In other words, a pair of slits 13s are formed in two positions that have line symmetry with respect to the longitudinal axis on the strip portion of the cylindrical part 22. Each slit 13s has a length of 300 to 400 μm, and a width of about 5 to 15 μm.

In this embodiment, the slit 13s is an elongated opening, and is formed in an axial direction of the cylindrical part 22. However, the slit is not limited to this configuration. For example, as will be described below based on FIG. 2D, to join the front end 22f to the rod-like part 24, for instance, resistance welding is used. When performing the resistance welding, if no slit 13s is formed in the front end 22f, when the front end 22f of the cylindrical part 22 is pinched by a pair of electrodes applied to carry out the resistance welding, a part of the front end 22f which is a portion perpendicular to the pinched direction swells outwardly, and thus a cross-sectional shape of the front end 22f becomes an approximately elliptical shape. For this reason, an outer diameter of the front end 22f is greater than that prior to the resistance welding. In contrast, if a portion corresponding to the portion swollen outside the slit 13s is cut out by the slit 13s, the swelling does not take place. As such, even when the front end 22f of the cylindrical part 22 is pinched by the pair of electrodes applied to carry out the resistance welding, the cross-sectional shape of the front end 22f can maintain an approximately circular shape. This concept will be described below in detail based on FIGS. 3A, 3B and 3C. In this way, when the front end 22f is pinched by the pair of electrodes applied to carry out the resistance welding, the slit is intended to previously cut out a part of the front end 22f which would be swollen if it were not for the slit. As such, the slit is not limited to the shape of an elongated opening, and thus it may be an opening having a width that varies as required. The width of the opening is not fixed. For example, the opening may be an elliptical or rhomboidal opening. Further, the slit is not limited to a direction in parallel with the longitudinal direction of the cylindrical part, and thus it may be formed in a direction at an angle to the longitudinal direction.

Further, the pair of electrodes 40 applied to carry out the resistance welding are disposed at positions that are shifted from the respective positions of the pair of slits 13s, which are formed in the outer surface of the cylindrical part 22, along the outer surface of the cylindrical part 22 by about 90 degrees relative to the axis. The width of each electrode (the length extending in the longitudinal direction of the connection terminal) is about 200 μm. In this manner, it is better for the length of the slit to be greater than the width of the electrode.

Further, the width of the slit 13s is not particularly limited as long as the outward swelling of the cylindrical part 22 as described above can be absorbed by the width of the slit 13s. However, the width of the slit 13s is preferably regulated by a difference between an inner circumference of the cylindrical part 22 and an outer circumference of the rod-like part 24. In short, the width of the slit 13s is desirably greater than a difference between a length L22, which goes around the axis on the inner circumferential surface of the cylindrical part 22, and a length L24, which goes around the axis on the outer circumferential surface of the rod-like part 24. That is, it is desirable that a relation is represented by L22-L24<the width of the slit 13s.

Further, as described above, the length of the slit 13s is desirably greater than the width of each electrode 40 of the resistance welding (the length extending in the longitudinal direction of the connection terminal). Further, it is desirable that opposite longitudinal ends of the slit 13s are all located more on an outer side than opposite ends of each electrode 40 of the resistance welding which runs in parallel in the same longitudinal direction. In other words, when the slit 13s and the electrode 40 overlap each other in the same longitudinal direction, a size relation that locates the electrode 40 between the opposite ends of the slit 13s is desirable.

To assemble the connection terminal 20, first, the rod-like part 24 is inserted into the cylindrical part 22. In this case, a portion that functions as the front end contacted with a predetermined test point of the target part of the specimen used as the test target of the connection terminal 20 protrudes to the outside. In FIG. 2D, as an example, the portion including the front end 24e of the rod-like part 24 protrudes from the front end face 22fe of the front end 22f of the cylindrical part 22 by a range of about 2 mm to 3 mm.

Next, the pair of electrodes 40 used to perform the resistance welding are disposed so as to vertically pinch the front end 22f of the cylindrical part 22. In this case, as shown in FIG. 2D, the electrodes 40 do not overlap the slits 13s, and the pair of slits 13s are disposed so as to be located on the front and rear sides of the space of FIG. 2D. In this state, when the front end 22f of the cylindrical part 22 is clipped by the pair of opposite electrodes 40 and is pressurized, and a predetermined electric current is applied, the electric current flows from one electrode 40 to the front end 22f of the cylindrical part 22 contacted with one electrode 40, the gold-plated layer of one inner surface of the front end 22f, one side of the rod-like part of tungsten, the other side of the rod-like part of tungsten, the gold-plated layer of the other inner surface of the front end 22f of the cylindrical part 22, the front end 22f of the cylindrical part 22, and the other electrode 40. Thereby, the gold-plated layer of the inner surface of the front end 22f of the cylindrical part 22 is melted by heat, and thus the front end 22f is welded with the rod-like part 24. Alternatively, instead of resistance welding, the opposite positions may be caulked to join the front end 22f of the cylindrical part 22 and the main body part 24b of the rod-like part 24.

Figure 3A:
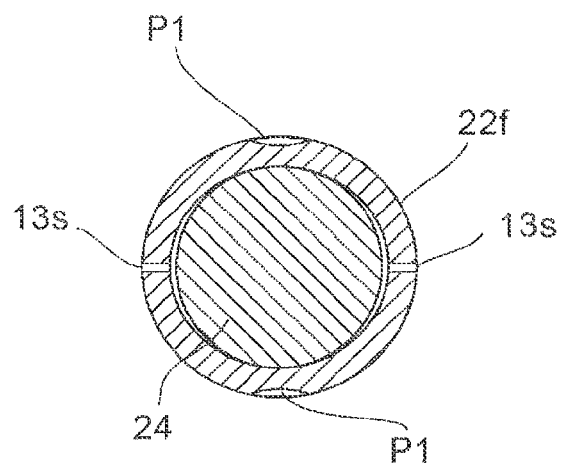
FIG. 3A is a cross-sectional view simplified when viewed in the direction of arrow 3A-3A of FIG. 2A.
Figure 3B:
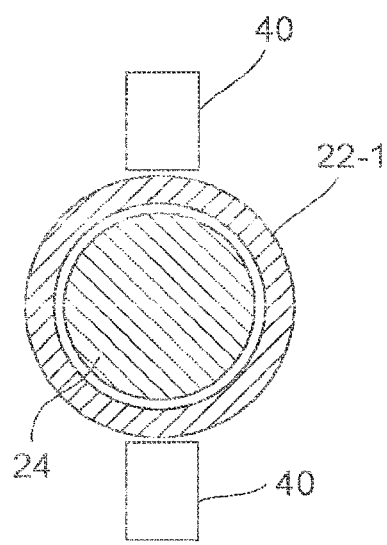
FIG. 3B is a conceptual view for describing a case in which fixating is done in the state in which the slit is formed in the connection terminal.
Figure 3C:
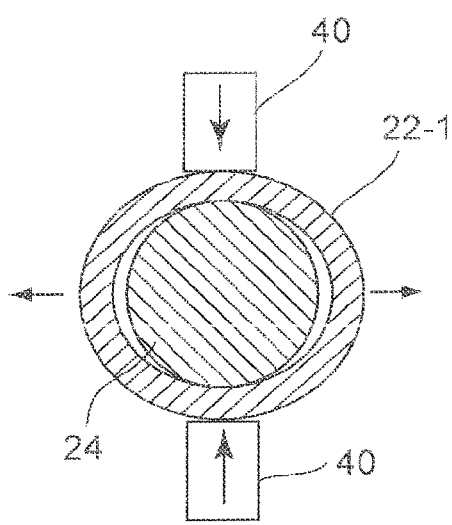
FIG. 3C is a conceptual view for describing a case in which fixating is done in the state in which the slit is formed in the connection terminal.

FIGS. 3A to 3C are enlarged cross-sectional views that provide a detailed description of a situation when the front end 22f of the cylindrical part 22 and the main body part 24b of the rod-like part 24 are welded.

FIG. 3A shows a state viewed in the direction of the arrow 3A-3A shown in FIG. 2A. In the event of the resistance welding, first, the pair of electrodes of the resistance welding are disposed at two positions P1 that are opposite to each other in a vertical direction and are shown in FIG. 3A, and the electrodes are used to apply force to the front end 22f of the cylindrical part 22 so that the cylindrical part is pinched. Thereby, a part of the inner surface of the front end 22f of the cylindrical part 22 is brought into contact with a part of the outer circumferential surface of the rod-like part 24. Next, in this state, electric current is supplied to the pair of electrodes. If so, the gold-plated layer of the inner surface of the front end 22f is melted by heat generated at this time, and thus the inner surface of the front end 22f and the outer circumferential surface of the rod-like part 24 are welded.

As shown in FIG. 3A, the pair of slits 13s are formed in the front end 22f of the cylindrical part 22. For this reason, when the cylindrical part 22 is pinched by the pair of electrodes used to carry out the resistance welding, portions of the cylindrical part 22 which are located in a direction perpendicular to a straight line connecting the pair of electrodes attempt to swell outward. However, since the portions to be swollen are cut out, the portions to be swollen do not swell, so that a cross section of the cylindrical part can maintain an approximately circular shape.

Here, from the viewpoint of the comparison with the present invention, a state in which the columnar part is joined in the cylindrical part, in which no slit 13s is formed, by the pair of electrodes for the resistance welding will be described based on FIGS. 3B and 3C. As shown in FIG. 3B, the rod-like part 24 is inserted into the front end 22-1 of the cylindrical part 22 having a circular cross section, and the pair of electrodes 40 used in the resistance welding are disposed at opposite positions above and below the front end of the cylindrical part 22. Next, as shown in FIG. 3C, the pair of electrodes 40 for the resistance welding are displaced in a direction moving towards each other as shown by arrows, and the front end 22-1 is pinched from top and bottom. Thereby, the inner surface of the front end 22-1 is brought into contact with the outer circumferential surface of the rod-like part 24. In this case, as shown in FIG. 3C, the front end 22-1 of the cylindrical part 22 is pinched by the electrodes, thereby approaching in a vertical direction, and becoming more distant so as to swell in a horizontal direction, so that the cross section of the cylindrical part 22 is deformed from a circular shape to an approximately elliptical shape. As a result, the outer diameter increased in a horizontal direction is greater than that of the cylindrical part 22 when the cross section is circular. When it is attempted to connect the connection terminal whose outer diameter has been increased in this way to, for instance, the test jig of FIG. 4, the connection terminal may not be inserted into a large-diameter part 12h1 of the through-hole 12h of the head part 12. This is because, with the miniaturization of a test target apparatus, dimensions of the through-hole holding a probe are also miniaturized.

In contrast to the configuration shown in FIGS. 3B and 3C, as shown in FIG. 3A, according to the cylindrical part 22 in which the slits 13s are formed, since it can maintain an approximately circular shape even when resistance welding is performed, the problem as mentioned above does not occur. The value of the slit is derived from this point.

As the shape of the slit, the aforementioned embodiment represents the hole of the elongated-shaped groove. However, the slit is designed so that, when the cylindrical part is pinched by the electrodes, the portions withdrawn in the direction perpendicular to the electrodes are previously removed, and thereby the cross-sectional shape of the cylindrical part maintains its circular shape. As such, as long as it is possible to form big enough of a space to first remove such a withdrawn portion, a cutout part of any shape may be used as the slit.

[Outline of Testing Jig]

Figure 4:
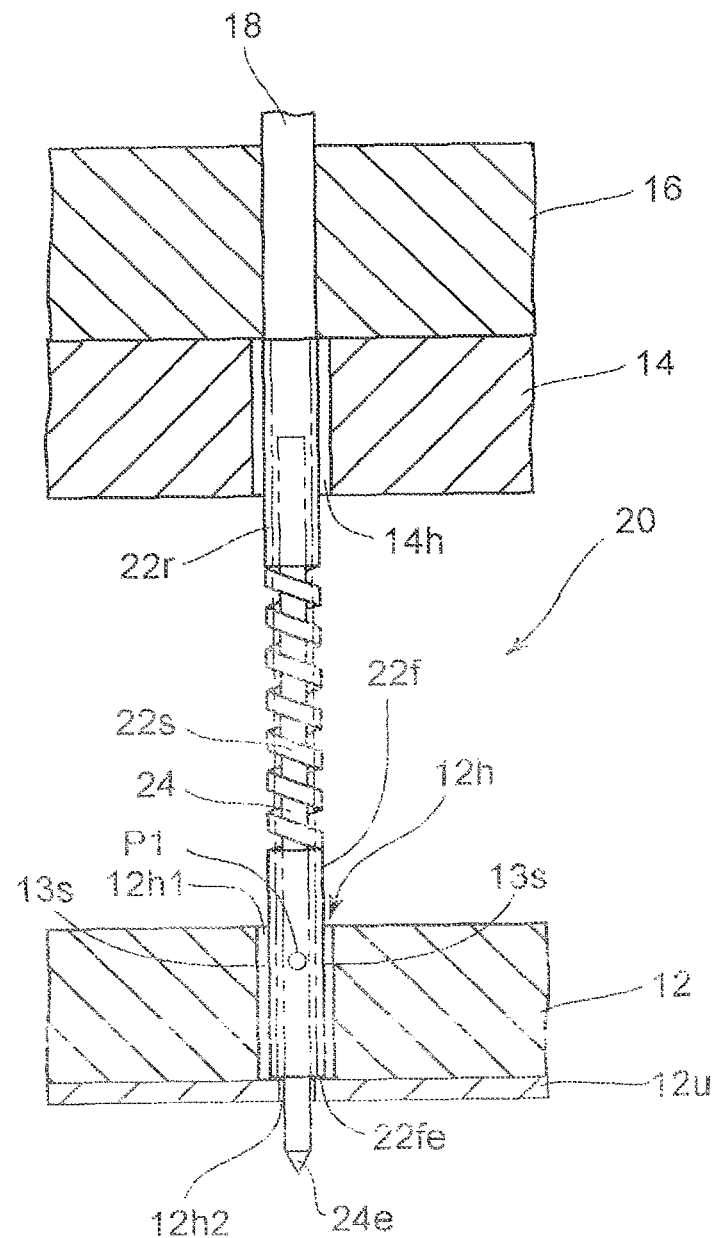
FIG. 4 is a partial enlarged cross-sectional view simplifying and showing a configuration of a part of a testing jig according to the embodiment of FIG. 1.

FIG. 4 is a partial enlarged cross-sectional view of the testing jig. As shown in FIG. 4, a thin plate 12u is attached to a lower surface of the head part 12. The head part 12 is provided with a large-diameter part 12h1, whereas the plate 12u is provided with a small-diameter part 12h2. However, without using the plate 12u, the large-diameter part 12h1 and the small-diameter part 12h2 may be formed in the head part 12 itself.

The front end 22f of the cylindrical part 22 of the connection terminal 20 is inserted into the large-diameter part 12h1.

As described above, the pair of slits 13s are formed in the front end 22f at opposite positions and the front end 22f is joined to the rod-like part 24 by resistance welding. Since the front end 22f maintains the approximately circular cross section even after resistance welding, the front end 22f can move in the large-diameter part 12h1 without making any contact with the inner wall at all. Further, the front end face 22fe of the front end 22f is in contact with a surface of the plate 12u, and the plate 12u is at a portion where the transition is made from the large-diameter part 12h1 to the small-diameter part 12h2. Furthermore, the rod-like part 24 is inserted into the small-diameter part 12h2, and the front end 24e protrudes from the head part 12. In this case, the surface of the plate 12u in which the small-diameter part 12h2 is formed functions as a locking part.

On the other hand, the rear end face of the rear end 22r of the connection terminal 20 is inserted into the through-hole 14h of the base part 14 to come into contact with an end face of the conducting wire 18.

In the state of FIG. 4, a distance from the surface of the plate 12u forming the locking part of the head part 12 to the end face of the conducting wire 18 of the electrode part 16 is shorter than a natural length of the cylindrical part 22 to which no load is applied as in FIG. 2A. For this reason, the front end 22f of the cylindrical part 22 is pressed upwards by the locking part, and the spring part 22s is contracted. Thereby, the rear end 22r of the cylindrical part 22 is pressed against the end face of the conducting wire 18 of the electrode part 16. For this reason, the contact resistance of the conducting wire 18 with the rear end 22r can be suppressed and made low.

Figure 5:
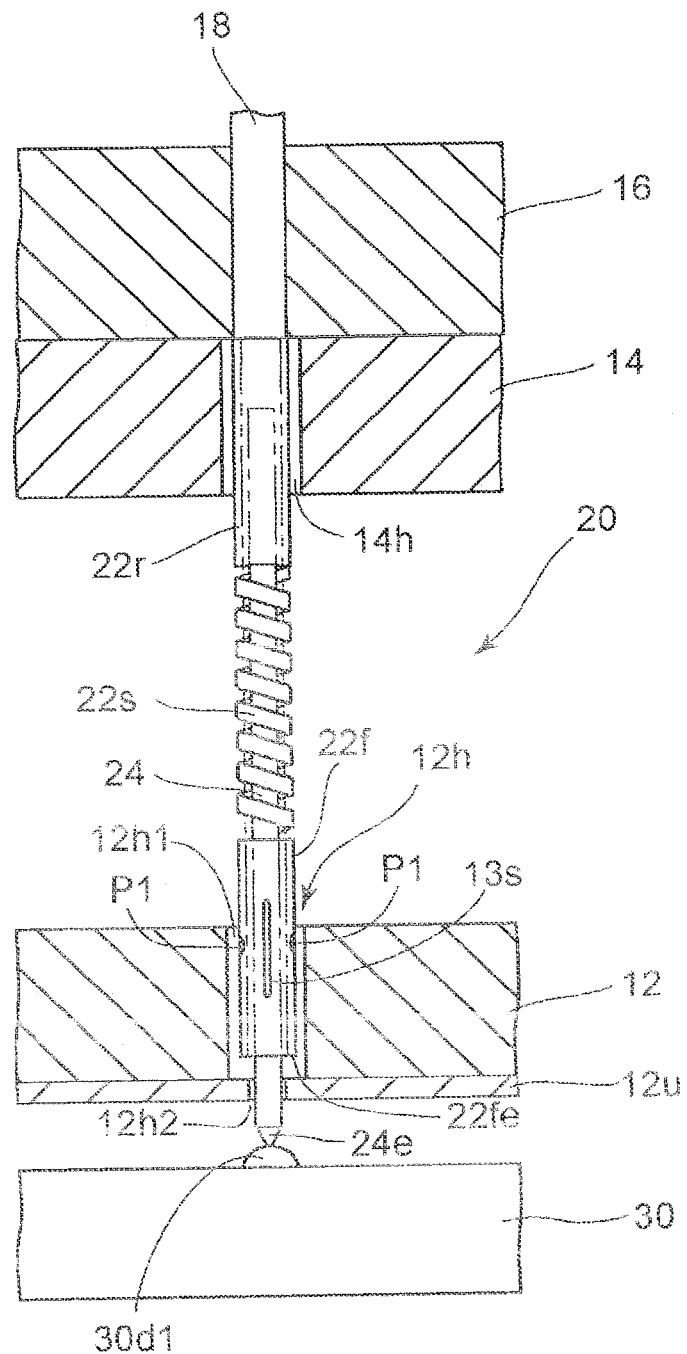
FIG. 5 is a partial enlarged cross-sectional view simplifying and showing a configuration of a part of a testing jig according to the embodiment of FIG. 1.

FIG. 5 is a partial enlarged cross-sectional view of a testing jig, which is intended to describe a situation when a specimen is tested using the testing jig of FIG. 4.

When a specimen such as a board is tested, a testing jig 10 is lowered to bring the front end 24e of the connection terminal 20 into contact with a predetermined test point 30d1 on a target part such as the wiring of the specimen 30. Thereby, as shown in FIG. 5, the rod-like part 24 of the connection terminal 20 is pressed upwards and inserted into the through-hole 12h of the head part 12. As described above, since the front end 22f of the cylindrical part 22 and the rod-like part 24 are joined at P1, when the rod-like part 24 is pressed upwards, the front end 22f of the cylindrical part 22 is pressed upwards along with the rod-like part 24. As a result, the front end face 22fe of the front end 22f of the cylindrical part 22 is separated from the surface of the plate 12u forming the locking part of the small-diameter part 12h2 of the head part 12. Further, as shown in FIGS. 4 and 5, since the front end 22f maintains the approximately circular cross section, the front end 22f can move in the large-diameter part 12h1 without making any contact with the inner wall at all.

When the test is completed and the testing jig 10 is separated from the specimen, the force that pressed upwards the front end 24e of the rod-like part 24 is removed. As such, the front end 22f of the cylindrical part 22 comes into contact with the surface of the plate 12u forming the locking part of the head part 12 again, and is held on the surface of the plate 12u (FIG. 4).

[Example of Manufacturing Connection Terminal]

FIGS. 6A to 6H are cross-sectional views showing an example of each process of manufacturing a connection terminal according to an embodiment of the present invention. Further, the connection terminal manufactured here is not only used independently, but also functions as the connection terminal by being combined with another cylindrical member or columnar member. In all the drawings, the thickness, length, and shape of each member, the interval and gap between the members, etc. are appropriately enlarged, contracted, modified, and simplified for the sake of easy understanding. In describing the drawing, the expressions of top and bottom or left and right are used to represent a direction taken along the surface of the drawing in a direction facing the drawing.

Figure 6A:
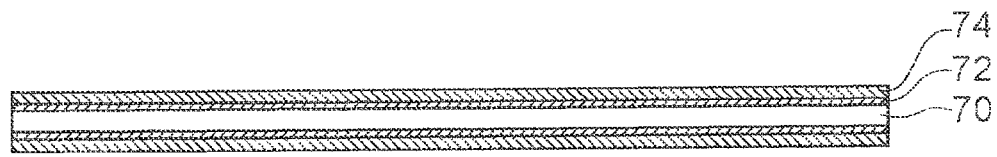
FIG. 6A is a cross-sectional view showing an example of a process of forming a nickel-plated layer in a method of manufacturing the connection terminal according to the present invention.

FIG. 6A shows a cross-sectional view of an electroformed pipe (cylindrical pipe) manufactured by forming a gold-plated layer 72 on an outer circumferential surface of a core 70 and forming a nickel-plated layer 74 on the gold-plated layer 72. As the core 70, for example, a metal wire or a resin wire having an outer diameter of 5 μm to 300 μm may be used. As the metal wire, for example, an SUS wire may be used. As the resin wire, a synthetic resin wire of a nylon resin or a polyethylene resin may be used. Further, the gold-plated layer 72 has a thickness of about 0.1 μm to 1 μm, the nickel-plated layer 74 has a thickness of about 5 μm to 50 μm. From the viewpoint of easy transfer work, the length of the electroformed pipe is desirably 50 cm or less, but it is not limited to this length. The electroformed pipe may be continuously manufactured without being cut.

Figure 6B:
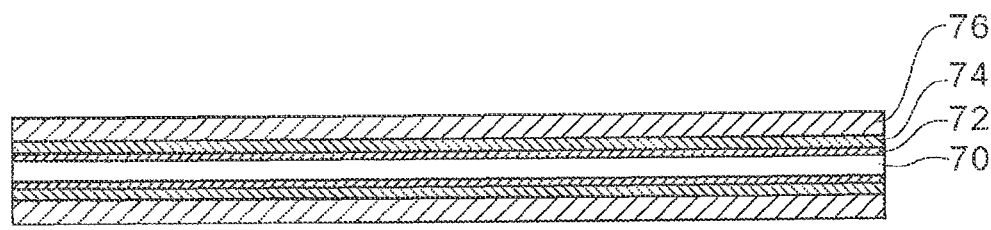
FIG. 6B is a cross-sectional view showing an example of a process of forming an insulating film in the method of manufacturing the connection terminal according to the present invention.

FIG. 6B shows an insulating film 76 formed on the outer circumferential surface of the nickel-plated layer 74 of the electroformed pipe shown in FIG. 6A. The insulating film 76 functions as a resist when a predetermined groove to be described below is formed. The insulating film has a thickness of about 2 μm to 50 μm. The insulating film 76 may be formed using, for instance, a fluorine coating or silicone resin material.

Figure 6C:
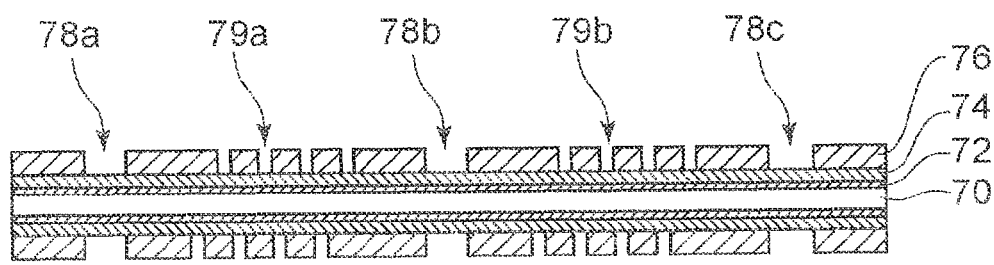
FIG. 6C is a cross-sectional view showing an example of a process of removing a part of the insulating film in the method of manufacturing the connection terminal according to the present invention.

Next, as shown in FIG. 6C, the insulating film 76 is removed in a circular shape of a predetermined width and separated, for instance, by intervals of 3 mm to 30 mm, thereby forming grooves 78a, 78b, and 78c. Further, a part of the insulating film between these grooves is removed in a helical shape, thereby forming a helical groove 79a or 79b. The nickel-plated layer 74 is exposed at portions where these grooves are formed.

When these grooves are formed, a method of applying a laser beam to the insulating film 76, and removing the insulating film 76 may be employed. In this case, the laser beam is directly applied while rotating the core 70 in a circumferential direction, thereby removing the insulating film 76. An output of the laser beam used in this method may remove only the insulating film 76, and is adjusted to an output that does not damage the nickel-plated layer.

Figure 6D:
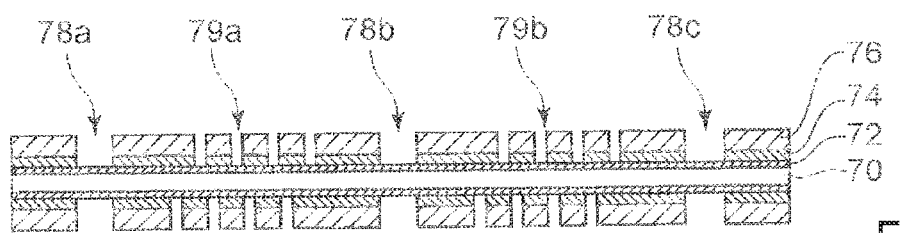
FIG. 6D is a cross-sectional view showing an example of a process of etching the nickel-plated layer in the method of manufacturing the connection terminal according to the present invention.

Next, as shown in FIG. 6D, the nickel-plated layer 74 exposed to the grooves 78a, 78b, 78c, 79a and 79b is removed by etching using the insulating film 76 as a mask, thereby exposing the gold-plated layer 72. Here, since the gold-plated layer 72 is interposed between the nickel-plated layer 74 and the core 70, a nickel etching solution can be prevented from arriving up to the core during etching. Since end faces of the nickel-plated layer 74 removed by the etching process are exposed to the grooves 78a, 78b, 78c, 79a and 79b and use a corrosion action caused by the etching solution, it is characterized by the formation of side etching parts (which will be described below).

Further, the helical grooves 79a and 79b are formed by removing the insulating film 76 located at their portions using a laser, and then removing the nickel-plated layer 74 exposed to their portions using etching. As such, the side etching parts are formed on end faces of the nickel-plated layer 74 at a portion (spring part to be described below) that is located in the helical groove. This stacked insulating film 76 is in an overhanged state with respect to the nickel-plated layer 74.

Figure 6E:
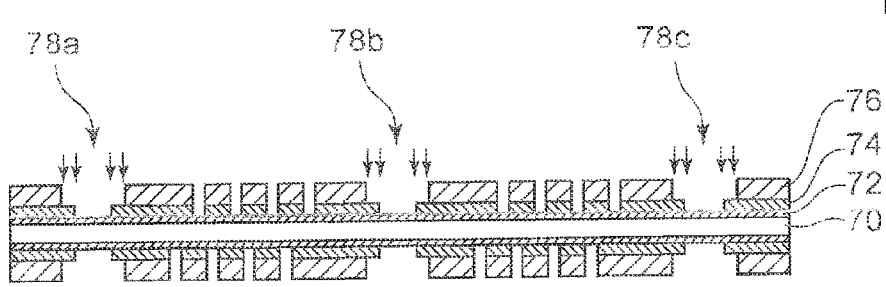
FIG. 6E is a cross-sectional view showing an example of a process of removing the insulating film at a predetermined portion in the method of manufacturing the connection terminal according to the present invention.

In FIG. 6E, the insulating film 76 to which the laser beam is applied to form the grooves 78a, 78b and 78c is removed from the end faces for a predetermined length, thereby exposing the nickel-plated layer 74. The exposed nickel-plated layer 74 is formed on the connection terminal for the connection jig, and becomes a portion functioning as the front which is in contact with the test target section or as the rear end which is in contact with the electrode of the connection jig connected to the test device, and its necessary length is selected depending on a structure of the connection jig. In consideration of these factors, the length by which the insulating film 76 is removed may be determined.

Figure 6F:
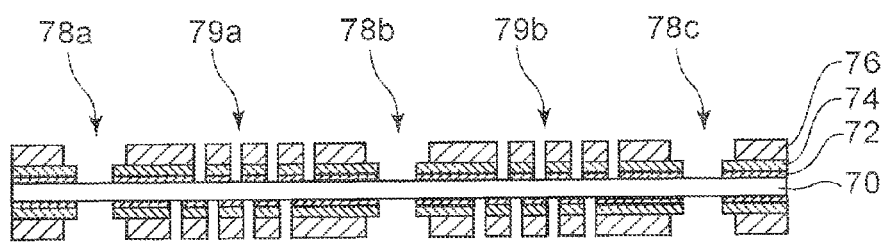
FIG. 6F is a cross-sectional view showing an example of a process of removing a gold-plated layer in the method of manufacturing the connection terminal according to the present invention.

Next, as shown in FIG. 6F, ultrasonic cleaning is performed to remove the gold-plated layer 72 exposed to the grooves 78a, 78b, 78c, 79a and 79b.

Figure 6G:
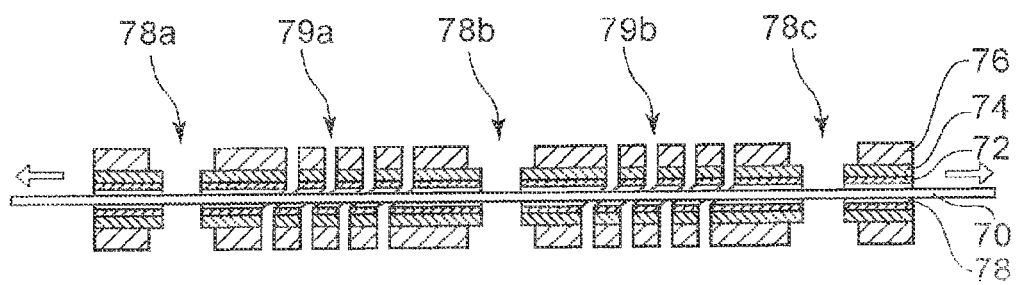
FIG. 6G is a cross-sectional view showing an example of a process of stretching a core in the method of manufacturing the connection terminal according to the present invention.

Subsequently, as shown in FIG. 6G, the core 70 is deformed so as to undergo a reduction in cross-sectional area by drawing opposite ends thereof in opposite directions as depicted by the outline arrows. One end may be fixed and only the other end may be pulled. When the core 70 is drawn so that its cross-sectional area is reduced, the gold-plated layer 72 with which the outer circumferential surface of the core 70 is covered is delaminated from the outer circumferential surface, and is left inside the electroformed pipe, so that a space 78 is formed between the core 70 and the gold-plated layer.

Figure 6H:
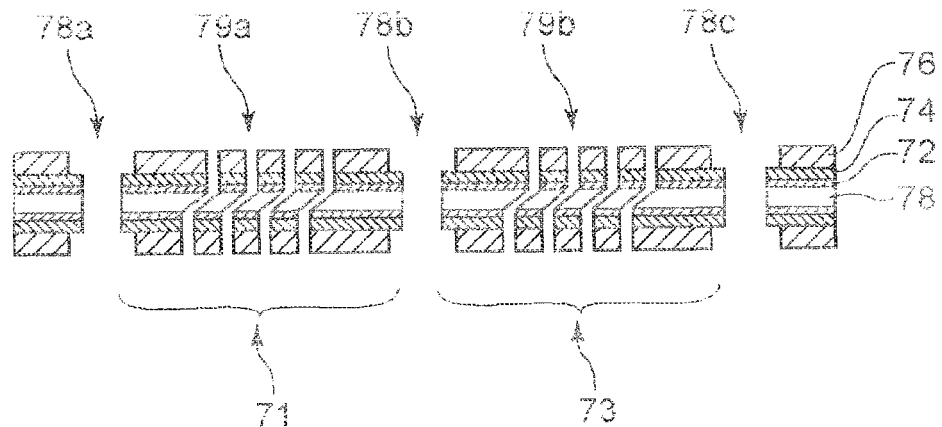
FIG. 6H is a cross-sectional view showing an example of a process of drawing a core in the method of manufacturing the connection terminal according to the present invention.

Next, as shown in FIG. 6H, when the core 70 is extracted, neighboring portions are separated by the grooves 78a, 78b and 78c, and a connection terminal 71 and a connection terminal 73 are individually formed. In this way, as shown in FIG. 6H, in the process of extracting the core 70, the connection terminal can be completed without requiring an additional process. Since FIGS. 6A to 6H are simplified to show only a part of the electroformed pipe, only two connection terminals are adapted to be manufactured in the process of FIG. 6H. However, numerous connection terminals may be manufactured once if a long electroformed pipe is used.

As shown in FIG. 6H, each of the connection terminals 71 and 73 has the nickel-plated layer 74 of the cylindrical pipe made of a conductive material, and front and rear ends where the nickel-plated layer is exposed at opposite end sides thereof. Further, the spring part having a helical wall surface in a long axial direction is formed between the front and rear ends. The insulating film 76 is formed along the helical wall surface.

The connection terminal of the present invention can be manufactured under the dimensional condition as described above. Particularly, in a case in which the connection terminal is formed so as to have an outer diameter of 30 to 100 µm, an inner diameter of 20 to 90 µm, and an insulating coating thickness of 2 to 15 µm, it can be properly used as the connection terminal for the connection jig.

Further, the cylindrical part 22 shown in FIG. 2B can be manufactured, for instance, by the manufacturing method shown in FIGS. 6A to 6H. For example, in the manufacturing process of FIG. 6C run through to form the helical groove, a part of the insulating film 76 is removed by applying the laser beam, and the nickel-plated layer 74 exposed to such a portion is removed by etching. In this process, similarly, the insulating film 76 is removed along the shape of the slit 13s by applying the laser beam, and the nickel-plated layer 74 exposed to such a portion is removed by etching, and thus the slit 13s can be formed.

[Structure of Another Probe]

Figure 7A:
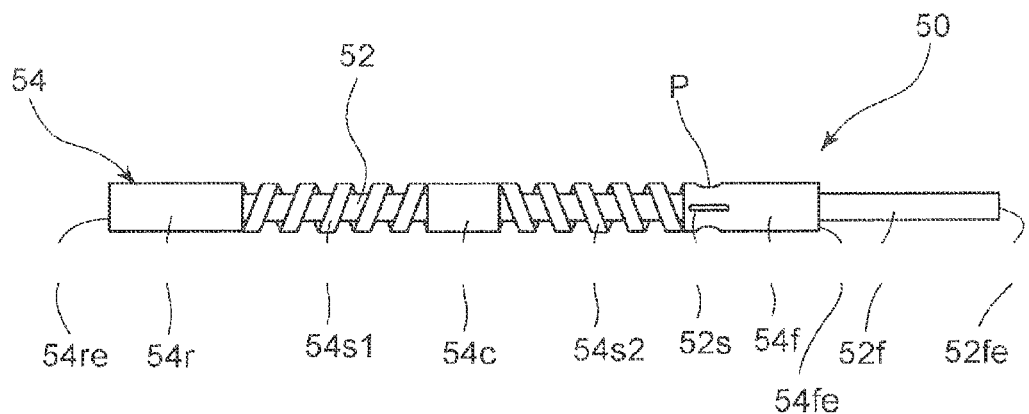
FIG. 7A is a side view showing a schematic configuration of a probe according to another embodiment.
Figure 7B:
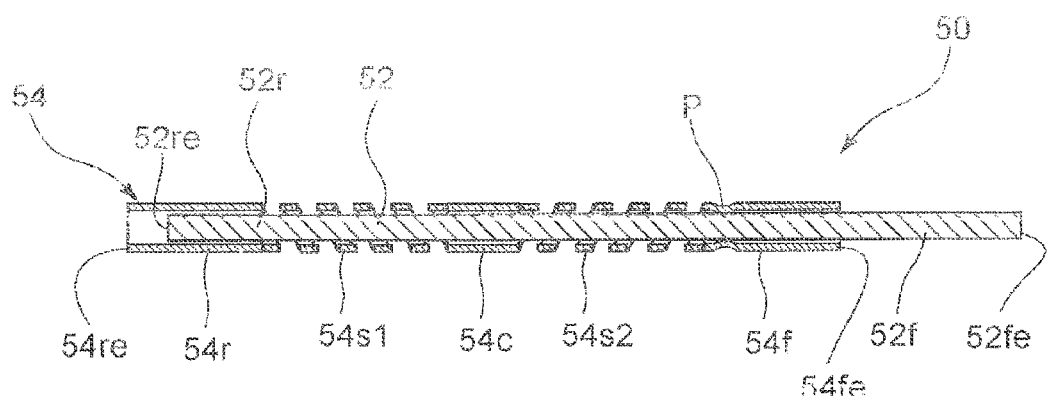
FIG. 7B is a central cross-sectional view of the probe shown in FIG. 7A.

FIGS. 7A and 7B show a probe 50 according to another embodiment. The probe 50 is made up of a large-diameter cylindrical part 54 and a small-diameter columnar part (conductive part) 52 inserted into the cylindrical part 54.

The large-diameter cylindrical part 54 includes a front end 54f, a rear end 54r, two spring parts 54s1 and 54s2 formed between the front and rear ends, and a coupling part 54c coupling the spring parts. The two spring parts 54s1 and 54s2 are formed in a helical shape, and gyrating directions thereof are opposite to each other. In short, if the spring part 54s1 gyrates from the coupling part 54c to the rear end 54r, for instance, in a counterclockwise direction, the spring part 54s2 gyrates from the coupling part 54c to the front end 54f in a clockwise direction.

The large-diameter cylindrical part 54 and the spring parts 54s1 and 54s2 may be manufactured similar to the cylindrical part 22 and the spring part 22s of the aforementioned embodiment.

The front end 52f of the small-diameter columnar part 52 protrudes from the front end 54f of the large-diameter cylindrical part 54. On the other hand, the rear end 52r of the small-diameter columnar part 52 remains at a position in front of a rear end face 54re of the rear end 54r of the large-diameter cylindrical part 54, and a space is formed between the rear end face 54re of the large-diameter cylindrical part 54 and a rear end face 52re of the small-diameter columnar part 52.

Further, like the front end 22f of the cylindrical part 22 of the connection terminal 20 shown in FIG. 2B, a strip portion around an axis of the front end 54f of the large-diameter cylindrical part 54 of FIG. 7A or 7B is provided with a slit 52s of a cutout part in a longitudinal direction. At a position P of the front end 54f of the large-diameter cylindrical part 54, the front end 54f and the small-diameter columnar part 52 are joined, for instance, by resistance welding or caulking, and are fixed to each other. For this reason, the small-diameter columnar part 52 and the front end 54f of the large-diameter cylindrical part 54 move as one body. When carrying out the resistance welding, due to the function of the slit 52s, the front end 54f can maintain a circular cross section before and after the resistance welding. At the portion other than this portion, the large-diameter cylindrical part 54 and the small-diameter columnar part 52 are not fixed, and thus can move independently of each other.

As will be described below, when a board is tested, the rear end face 54re of the rear end 54r of the large-diameter cylindrical part 54 is in contact with an electrode (conducting wire 18) of a test jig. In this state, when the front end face 52fe of the front end 52f of the small-diameter columnar part 52 comes into contact with a test point and is pressed, the small-diameter columnar part 52 is retreated by the magnitude of the pressed force applied along with the front end 54f of the large-diameter cylindrical part 54. For this reason, the two spring parts 54s1 and 54s2 of the large-diameter cylindrical part 54 are contracted, and simultaneously the small-diameter columnar part 52 is retreated in a space inside the spring parts. In proportion to a length by which each spring is contracted, each spring exerts a biasing force attempting to return back to its original length. Since a load of each spring is proportional to the length of the displacement of the spring, when the length of the contracted spring varies, a magnitude of the force (load) with which the front end face 52fe of the front end 52f of the columnar part 52 pushes the test point by means of the two spring parts 54s1 and 54s2 varies.

For this reason, when caulking is performed at the position P of the front end 54f of the large-diameter cylindrical part 54, the magnitude of the force (load) with which the front end face 52fe is applied to the test point can be changed by changing the length by which the front end 52f of the small-diameter columnar part 52 protrudes from the front end 54f.

Further, when the probe 50 is attached to the test jig, the two spring parts 54s1 and 54s2 function as biasing parts that apply a preload that presses the rear end face 54re of the rear end 54r of the large-diameter cylindrical part 54 against the conducting wire 18 with the proper amount of force. Further, the small-diameter columnar part 52 is fixed to the front end 54f of the large-diameter cylindrical part 54, and thereby the two spring parts 54s1 and 54s2 also function as pressurizing parts that press the front end face 52fe of the small-diameter columnar part 52 against the test point with the proper elastic force and stabilize contact resistance.

Figure 8:
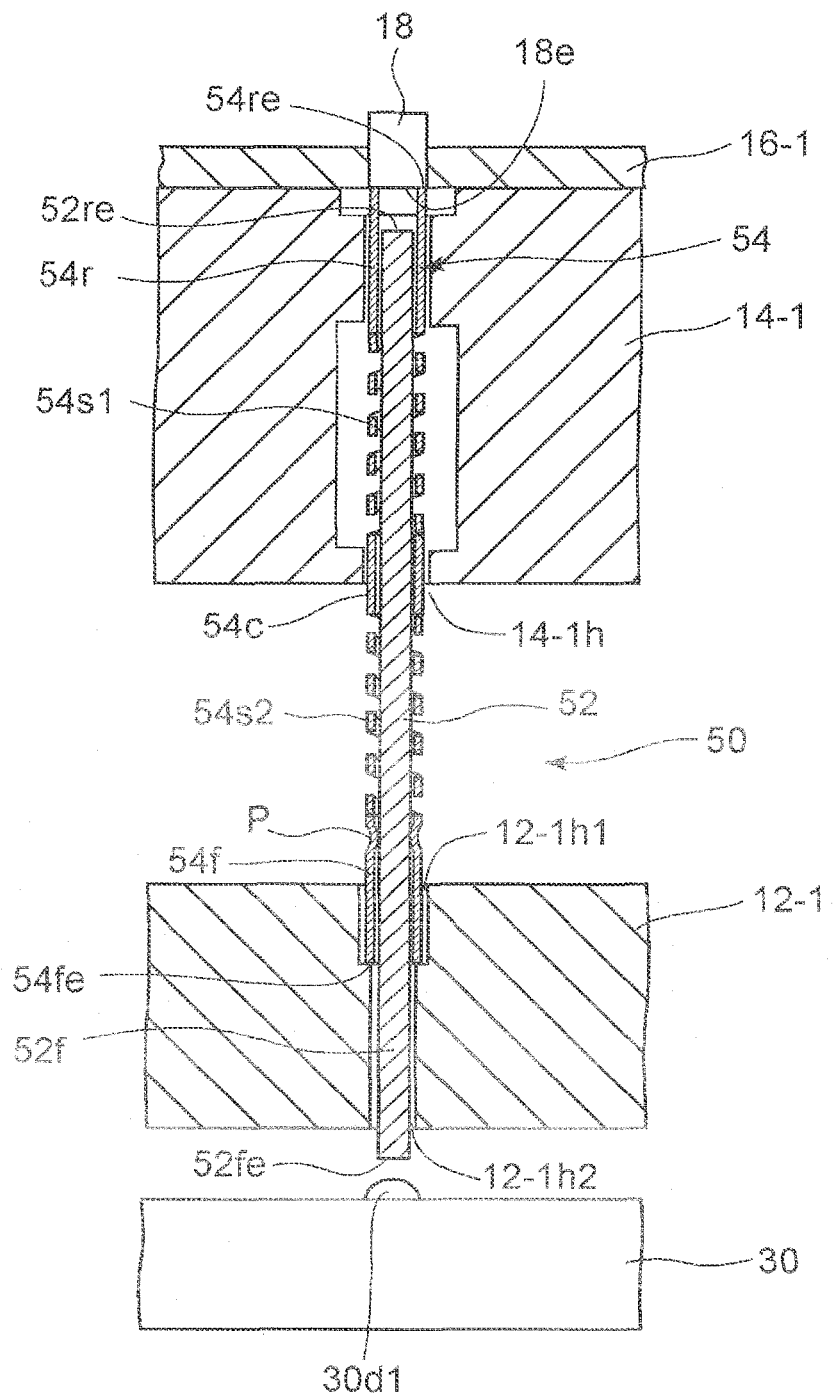
FIG. 8 is a cross-sectional view simplifying and showing a configuration of a part of the testing jig to which the probe according to the embodiment of FIGS. 7A and 7B is attached.

FIG. 8 is a partial cross-sectional view of the testing jig to which the probe 50 shown in FIGS. 7A and 7B is attached. As shown in FIG. 8, a head part 12-1 is provided with a through-hole 12-1h1 of a large-diameter part and a through-hole 12-1h2 of a small-diameter part, and a base part 14-1 is provided with a through-hole 14-1h, a part of which is widened.

The front end 54f of the large-diameter cylindrical part 54 of the probe 50 is inserted into the large-diameter part 12-1h1 of the head part 12-1, and the front end face 54fe thereof is in contact with a stepped face of an area transitioning from the large-diameter part 12-1h1 to the small-diameter part 12-1h2. In this way, the stepped face forms a locking part of the front end face 54fe. The front end 52f of the small-diameter columnar part 52 of the probe 50 is inserted into the small-diameter part 12-1h2.

On the other hand, the rear end 54r of the large-diameter cylindrical part 54 of the probe 50 and a part of the coupling part 54c are inserted into the through-holes 14-1h of the base part 14-1. The rear end face 54re is in contact with the end face 18e of the conducting wire 18. The rear end face 52re of the small-diameter columnar part 52 is separated from the end face 18e.

Further, before the probe 50 is assembled to the testing jig, a natural length from the front end face 54fe to the rear end face 54re of the large-diameter cylindrical part 54 of the probe 50 is greater than a distance from the stepped face (locking part) of an area transitioning from the large-diameter part 12-1h1 to the small-diameter part 12-1h2 of the head part 12-1 of the test jig to the end face 18e of the conducting wire 18. For this reason, as in FIG. 8, when the probe 50 is assembled to the testing jig, the large-diameter cylindrical part 54 is pressed by the locking part and the end face 18e. As such, the two spring parts 54s1 and 54s2 are contracted because of the difference between their magnitudes. Due to this contraction, these spring parts exert a biasing force attempting to return back to their original lengths.

When a specimen is tested using this testing jig, the testing jig is lowered to bring the small-diameter front end 52fe of the probe 50 into contact with a predetermined test point 30d1 on a test target section such as the wiring of the specimen 30 so as to press the test point 30d1 with a predetermined magnitude of force. If so, the front end 52f of the small-diameter columnar part 52 of the probe 50 is pressed into the through-hole 12-1h2 of the head part 12-1. In this case, as described above, since the columnar part 52 of the small-diameter part and the front end 54f of the large-diameter cylindrical part 54 are joined at the position P, when the front end 52f is pressed, the front end 54f of the large-diameter cylindrical part 54 is also pressed along with the front end 52f, and the front end face 54fe of the front end 54f is separated from the locking part. As a result, the two spring parts 54s1 and 54s2 of the large-diameter cylindrical part 54 are compressed. As such, a biasing force attempting to return back to an original length is generated from each of the spring parts. Due to this biasing force, the front end face 52fe is pressed against the test point 30d1, and it can be ensured that the contact of the front end face 52fe and the test point 30d1 is sturdy.

As described above, since the gyrating directions are opposite to each other, the biasing force generated when each of the two spring parts 54s1 and 54s2 is pressed and contracted is applied in a direction that causes the coupling part 54c to gyrate in the same direction. For this reason, these spring parts are difficult to bend or twist, compared to the case in which two helical springs gyrating in the same direction are coupled to each other.

Figure 12A:
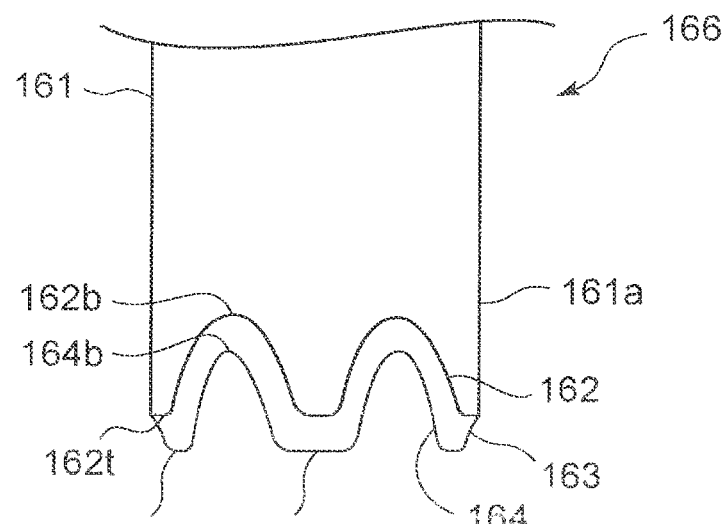
FIG. 12A is an enlarged front view showing the abutting part of the connection terminal according to the other embodiment of the present invention.

Although not limited to the embodiment of FIGS. 7A, 7B and 8, a shape of the front end face 52fe of the columnar part 52 which is in contact with the specimen 30 may be a flat shape, a curved and protruding shape such as a spherical shape, a shape in which a small protrusion protrudes like an embodiment of a so-called crown as shown in FIG. 12A to be described below, or a shape that is cut into a surface inclinedly intersecting a longitudinal axis of the columnar part. For example, in a case in which the front end of the columnar part which has one such shape and the columnar part is pressed against the specimen 30, when the columnar part pivots around the longitudinal axis thereof by means of the action of each spring part, the front end face of such a shape is allowed to scratch or scrape the oxide film off of the surface of the specimen 30.

[Structure of Another Probe]

Figure 9A:
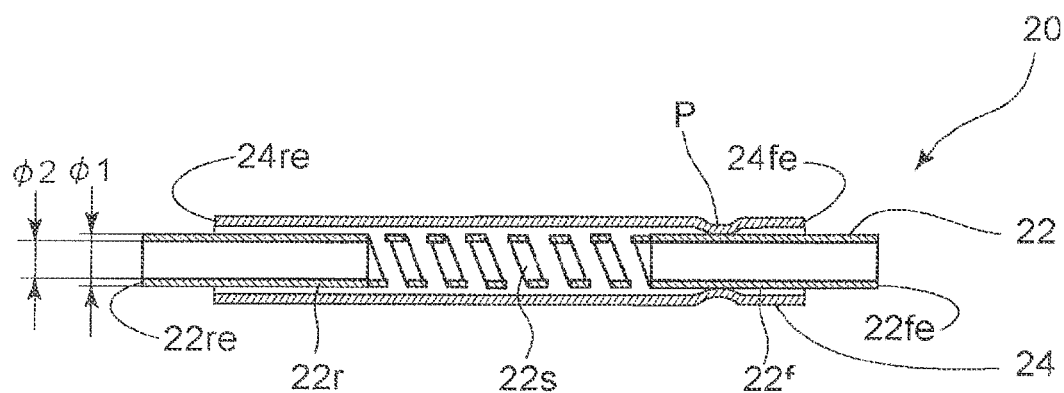
FIG. 9A is a partial cross-sectional view showing a schematic configuration of the probe that can be used for the testing jig of FIG. 1 in accordance with the embodiment.
Figure 9B:
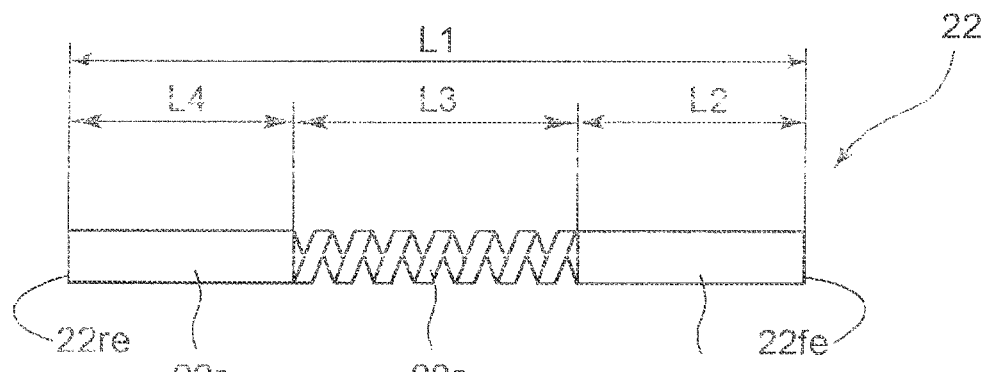
FIG. 9B is a schematic configuration view showing an example of a part of the constituent member of the probe of FIG. 9A.
Figure 9C:
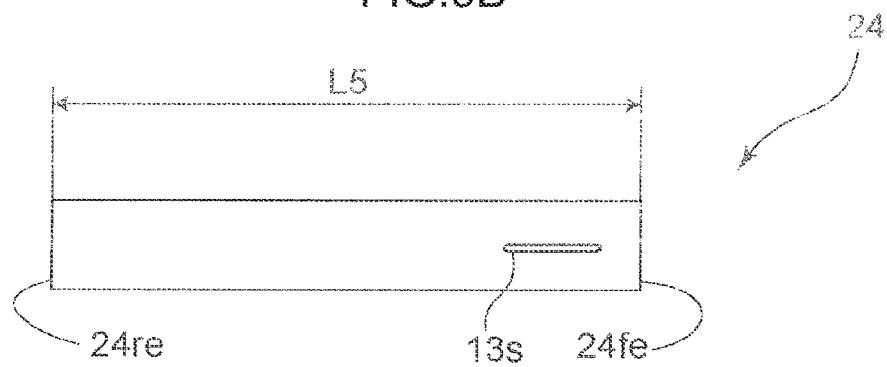
FIG. 9C is a schematic configuration view showing an example of a part of the constituent member of the probe of FIG. 9A.

FIGS. 9A to 9C are side views enlarged and simplified to describe a probe 20 that can be used for the testing jig of FIG. 1 in accordance with another embodiment.

FIG. 9A shows a probe 20 that can be used for the testing jig of FIG. 1 in accordance with another embodiment. The probe 20 is made up of a large-diameter cylindrical part 24 and a conductive small-diameter cylindrical part (conductive part) 22 inserted into the large-diameter cylindrical part 24.

The small-diameter cylindrical part 22 includes a cylindrical front end 22f, a cylindrical rear end 22r, and a spring part 22s formed between these ends. The spring part 22s is formed in a helical shape.

A portion adjacent to a front end face 22fe of the front end 22f of the small-diameter cylindrical part 22 protrudes from the front end face 24fe of the large-diameter cylindrical part 24. Further, a portion adjacent to a rear end face 22re of the rear end 22r of the small-diameter cylindrical part 22 protrudes from the rear end face 24re of the large-diameter cylindrical part 24.

Further, like the front end 22f of the cylindrical part 22 of the connection terminal 20 shown in FIG. 2B, as shown in FIG. 9C, a slit 13s of a cutout part is formed in a longitudinal direction of a strip portion around an axis of the front end 24f of the large-diameter cylindrical part 24. At position P adjacent to the front end face 24fe of the large-diameter cylindrical part 24, the large-diameter cylindrical part 24 and the front end 22f of the small-diameter cylindrical part 22 are joined, for instance, by resistance welding and caulking, and are fixed to each other. For this reason, the large-diameter cylindrical part 24 and the front end 22f of the small-diameter cylindrical part 22 move as one body.

As will be described below, when the front end face 22fe of the small-diameter cylindrical part 22 is in contact with the test point and is pressed from the test point to perform testing, the rear end face 22re of the small-diameter cylindrical part 22 is pressed against an end face of the conducting wire 18 of the testing jig. Thereby, the rear end 22r of the small-diameter cylindrical part 22 is inserted into the large-diameter cylindrical part 24. The inserted distance becomes a contracted length of the spring part 22s. Since a load placed on a spring is proportional to the displacement of the spring, a magnitude of force (load) with which the front end face 22fe of the cylindrical part 22 presses the test point is changed by changing the contracted length.

For this reason, for example, when a distance until the rear end face 22re is inserted into the cylindrical part 24 is increased using a different dimensional separate small-diameter cylindrical part in which the cylindrical part 22 adjacent to the rear end face 22re protruding from the rear end face 24re is long, the range within which the magnitude of the load which the front end face 22fe applies to the test point can be adjusted can be increased.

As will be described in more detail, the front end 22f of the small-diameter cylindrical part 22 is fixed to the large-diameter cylindrical part 24. Thereby, the spring part 22s functions as a biasing part that gives preload pressing the rear end 22r against the end face of the conducting wire 18 before the test is performed, and simultaneously as a pressurizing part that presses the front end 22f against the test point with a proper amount of elastic force and reduces contact resistance when the test is performed.

FIG. 9B shows the small-diameter cylindrical part 22 constituting the probe 20. As the cylindrical part 22, for example, a tube of nickel or a nickel alloy having an outer diameter of about 25 to 280 μm and an inner diameter of 15 to 260 μm may be used. In this embodiment, as an example, a nickel tube having an outer diameter of about 50 μm, an inner diameter of about 35 μm, and a total length L1 of about 6 mm is used. However, the cylindrical part 22 is not limited to this tube.

Further, the cylindrical front end 22f has a length L2 of about 2 mm, the spring part 22s has a length L3 of about 2 mm, and the rear end 22r has a length L4 of about 2 mm. These values are given as an example. The embodiment is not limited to these values.

FIG. 9C shows the large-diameter cylindrical part 24 constituting the probe 20. The large-diameter cylindrical part 24 may be made of a tube of nickel or nickel alloy. As dimensions of the large-diameter cylindrical part 24, for example, an outer diameter ranges from 35 μm to 300 μm, an inner diameter ranges from 25 μm to 280 μm, and a length L5 ranges from 3 mm to 30 mm. These values are given as examples. The embodiment is not limited to these values. Alternatively, a circumferential surface of the large-diameter cylindrical part 24 may be coated with an insulating film as needed.

For example, in the case based on resistance welding, like the case of FIG. 2D, constant electric current is applied for a short time while the position P of the large-diameter cylindrical part 24 is pinched and pressurized by a pair of electrode parts facing each other. Thereby, the large-diameter cylindrical part 24 and the front end 22f of the small-diameter cylindrical part 22 are welded at this position. Instead of this configuration, they may be coupled by applying, caulking and deforming force at this position P. In this case, due to an action of the slit 13s, the large-diameter cylindrical part 24 can maintain a circular cross section before/after resistance welding is performed.

FIGS. 10A to 12B show some embodiments that are characterized by a shape of an abutting part of a front end of a cylindrical connection terminal. This connection terminal may also be used for a testing probe as well as a connection jig that electrically connects a target and a given device, and another connection jig such as an interposer or a connector that connects electrode terminals to each other.

Figure 10A:
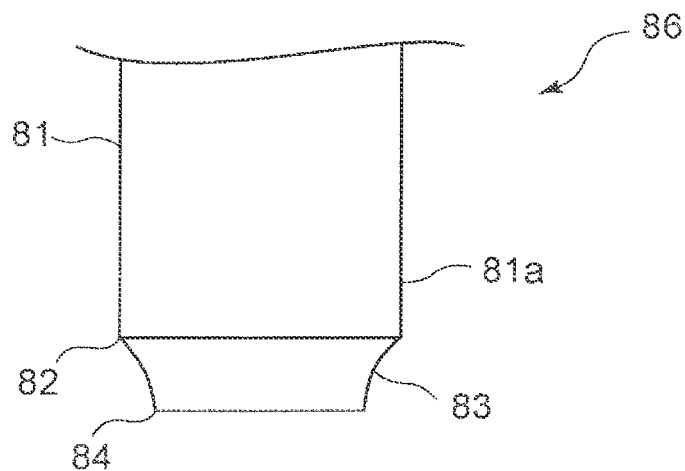
FIG. 10A is an enlarged front view showing an abutting part of the connection terminal according to the embodiment of the present invention.
Figure 10B:
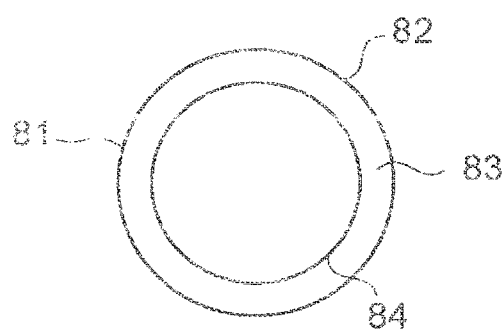
FIG. 10B is an enlarged front view showing the abutting part of the connection terminal shown in FIG. 10A according to the embodiment of the present invention.

FIG. 10 is an enlarged front view showing an abutting part 81a of a connection terminal 86. The abutting part 81a is a portion, a part of which is at least in contact with and electrically connected with the target point of the target. FIG. 10B is a bottom view of the connection terminal 86 of FIG. 10A. The connection terminal 86 electrically connects the target point formed on the target and a given connection point, and thus includes a cylindrical part 81 formed of a layer plated with a conductive material.

As shown in FIG. 10B, the cylindrical part 81 is formed by an inner wall surface and an outer wall surface, and has a space in the center thereof. A front end (lower portion in FIG. 10A) of the cylindrical part 81 is provided with an abutting part 81a that includes an edge 82 of the outer wall surface, an edge 84 of the inner wall surface, and a surface 83 interconnecting these edges.

The surface 83 of the abutting part 81a may be formed by, for instance, etching. This method will be described. For example, as shown in FIG. 6B, the insulating film 76 is formed on the outer circumferential surface of the nickel-plated layer 74 of the electroformed pipe, thereby making a cylindrical body. Depending on a length of the connection terminal, a predetermined length of the insulating film 76 is removed from the cylindrical body by a laser beam according to a need for a contact by use of the insulating film 76 as a mask, and then is etched. Then, the abutting part 81a shown in FIG. 10A is exposed.

A side etching part is formed at an end of the nickel-plated layer 74 by this isotropic etching. In this case, an etching solution at each end of the cylindrical body flows around the outer wall surface of the cylindrical body of the nickel-plated layer 74 adjacent to the insulating film 76, and erodes the outer wall surface. As such, the outer wall surface is more eroded than the inner wall surface. Since the insulating film 76 is not indispensable, when the insulating film is not formed, etching is carried out using a resist film.

As a result of forming the side etching part at the end of the cylindrical body, as shown in FIG. 10A, the shape of the surface 83 is not a flat shape but a curved shape (curved surface 83). An area, size, and curvature of the curved surface may be changed by changing a blending rate, concentration, temperature, etc. of chemicals of the etching solution, or by changing various conditions such as intensity of applied voltage when etched.

Figure 11A:
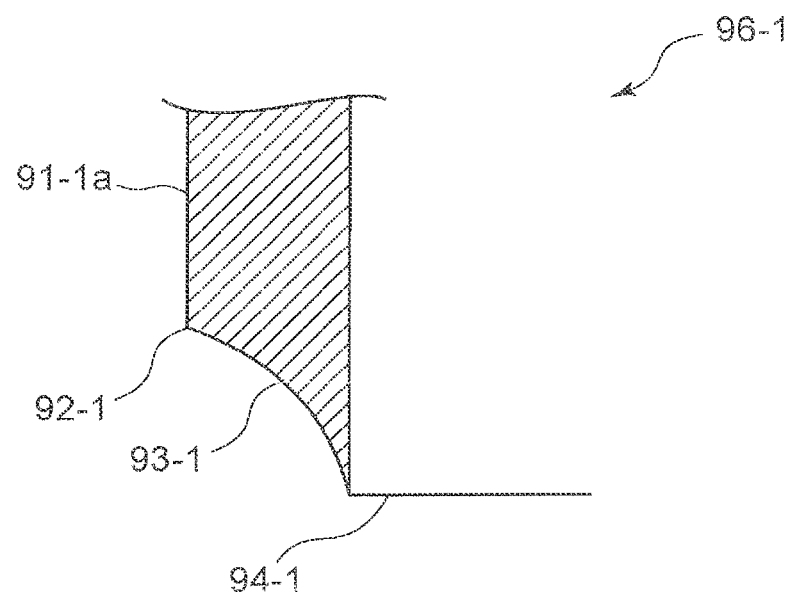
FIG. 11A is a partial enlarged front view showing the abutting part of the connection terminal according to the embodiment of the present invention.

FIG. 11A shows a cross section of a part of an abutting part 91-1a of a connection terminal 96-1. The abutting part 91-1a includes an edge 92-1 of an outer wall surface, an edge 94-1 of an inner wall surface, and a surface 93-1 between these edges Like the abutting part 81a shown in FIGS. 10A and 10B, the abutting part 91-1a has a curved surface 93-1. As shown in FIG. 11A, the edge 92-1 of the outer wall surface and the edge 94-1 of the inner wall surface are located at different positions in an axial direction of the connection terminal 96-1 (in a top-to-bottom direction in FIG. 11A). In short, in FIG. 11A, the position of the edge 92-1 of the outer wall surface is located on an upper side (rear end side of the connection terminal) in the axial direction, compared to the position of the edge 94-1 of the inner wall surface. For this reason, the surface 93-1 extends so as to connect the edge 92-1 of the outer wall surface and the edge 94-1 of the inner wall surface in an inclined direction. Thereby, the edge 94-1 of the inner wall surface forms a sharp tip. Since this sharp tip can easily eat into the target point of the target, the contact characteristics (contact stability) of the connection terminal with the target are improved. Further, an attached matter attached to the sharp tip is easily detached in the event of making a subsequent contact. Due to this self-cleaning function, the contact characteristics of the connection terminal with the target are improved.

Figure 11B:
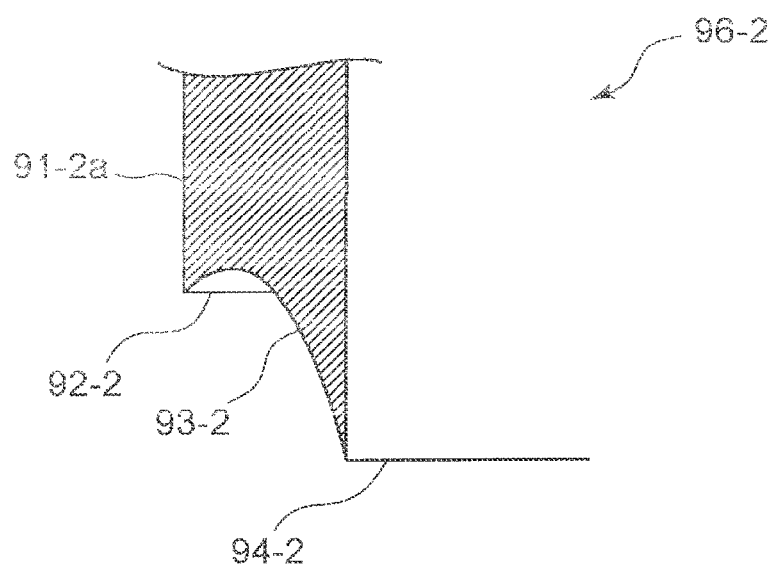
FIG. 11B is a partial enlarged front view showing an abutting part of a connection terminal according to another embodiment of the present invention.

Further, FIG. 11B shows a cross section of a part of an abutting part 91-2a of a connection terminal 96-2 according to another embodiment. The abutting part 91-2a includes an edge 92-2 of an outer wall surface, an edge 94-2 of an inner wall surface, and a surface 93-2 between the edges. As shown in FIG. 11B, like the abutting part 91-1a of FIG. 11A, the edge 94-2 of the inner wall surface of the abutting part 91-2a has a sharp tip. However, in comparison with the surface 93-1 of the abutting part 91-1a of FIG. 11A, a curvature of the curved surface of the surface 93-2 of the abutting part 91-2a of FIG. 11B is smaller. The surface 93-2 has an apex (or a bottom) located on an upper side (rear end side of the connection terminal 96-2) of the drawing, compared to the edge 92-2 of the outer wall surface, and is formed in a concave shape.

Figure 13A:
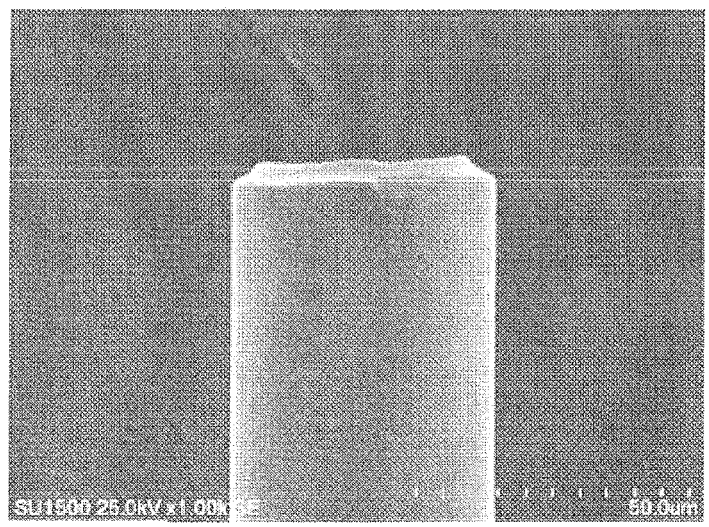
FIG. 13A is a magnified photograph taken by a scanning electron microscope of an abutting part corresponding to the abutting part of the connection terminal of FIGS. 10A and 10B.

FIG. 13A is a magnified photograph taken by a scanning electron microscope and is intended to describe an example in which the abutting part is formed at the end of the nickel-plated layer of the cylindrical body by side etching. The abutting part of the connection terminal shown in this photograph has an outer diameter of about 50 μm, an inner diameter of about 40 μm, and an axial distance of about 4 μm between the edge of the outer wall surface and the edge of the inner wall surface. As is apparent from this photograph, the surface between the edge of the outer wall surface and the edge of the inner wall surface is curved.

A difference between the inclined sizes of the surfaces 93-1 and 93-2 adjacent to the edges 94-1 and 94-2 of the inner wall surfaces, i.e. adjacent to the tips, shown in FIGS. 11A and 11B respectively is summarized as follows. In FIG. 11A, an angle from the inner wall surface to the tangent to the surface 94-1 varies from about 20° to about 80° while a position of a tangent point of the tangent moves from the edge 94-1 of the inner wall surface to the edge 92-1 of the outer wall surface, whereas, in FIG. 11B, an angle from the inner wall surface to the tangent to the surface 93-2 varies from about 15° to about 120° while a position of the tangent moves from the edge 94-2 of the inner wall surface to the edge 92-2 of the outer wall surface. That is, the front end of the abutting part 91-1a of FIG. 11A is sharper than the front end of the abutting part 91-2a of FIG. 11B.

Figure 12B:
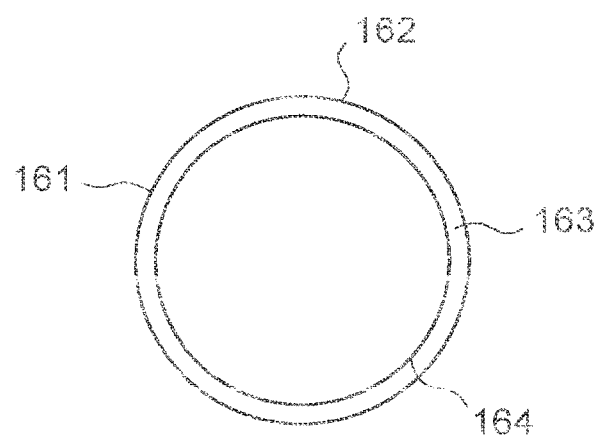
FIG. 12B is an enlarged bottom view showing the abutting part of the connection terminal shown in FIG. 12A.

FIG. 12A is an enlarged front view of a connection terminal 166 having an abutting part 161a, a shape of which is different from that of the abutting part 81a of the connection terminal 86 of FIG. 10A. FIG. 12B is a bottom view of the connection terminal 166 of FIG. 12A. Like the connection terminal 86 of FIG. 10A, the connection terminal 166 electrically connects the target point formed on the target and a given connection point, and thus includes a cylindrical part 161 formed of a layer plated with a conductive material.

As shown in FIG. 12B, the cylindrical part 161 is formed by an inner wall surface and an outer wall surface, and has a space in the center thereof. A front end (lower portion in FIG. 12A) of the cylindrical part 161 is provided with an abutting part 161a that includes an edge 162 of the outer wall surface, an edge 164 of the inner wall surface, and a surface 163 interconnecting these edges.

However, unlike the surface 83 of FIG. 10A, as shown in FIG. 12A, the edge 162 and 164 of the surface 163 of the abutting part 161a have cutout parts formed along an circular circumferential surface of the cylindrical part 161 at regular intervals in an approximately U shape. Like the surface 83 of the abutting part 81a, the cutout parts may be formed by etching.

For example, as shown in FIG. 6B, the insulating film 76 is formed on the outer circumferential surface of the nickel-plated layer 74 of the electroformed pipe, thereby making a cylindrical body. Depending on a length of the connection terminal, the insulating film 76 is removed along the circular circumference of each end of the cylindrical body in an approximately U shape by a laser beam, thereby exposing the nickel-plated layer 74. In this state, the cylindrical body is etched using the remaining insulating film 76 as a mask. In this case, at each end of the cylindrical body, an etching solution flows around the outer wall surface of the cylindrical body of the nickel-plated layer 74 from an edge of the insulating film 76, thereby eroding the outer wall surface. As such, the outer wall surface is more eroded than the inner wall surface. As a result, the nickel-plated layer 74 is also eroded in an approximately U shape at a position where the insulating film 76 is removed in an approximately U shape.

As a result, as shown in FIG. 12A, in the abutting part 161a, a maximum protruding position 162t of the edge 162 of the outer wall surface and a maximum recessed position 162b of the edge 162 of the outer wall surface is greatly separated in an axial direction of the connection terminal 166. Further, a maximum protruding position 164t of the edge 164 of the inner wall surface and a maximum recessed position 164b of the edge 164 of the inner wall surface is also greatly separated in an axial direction of the connection terminal 166.

Figure 13B:
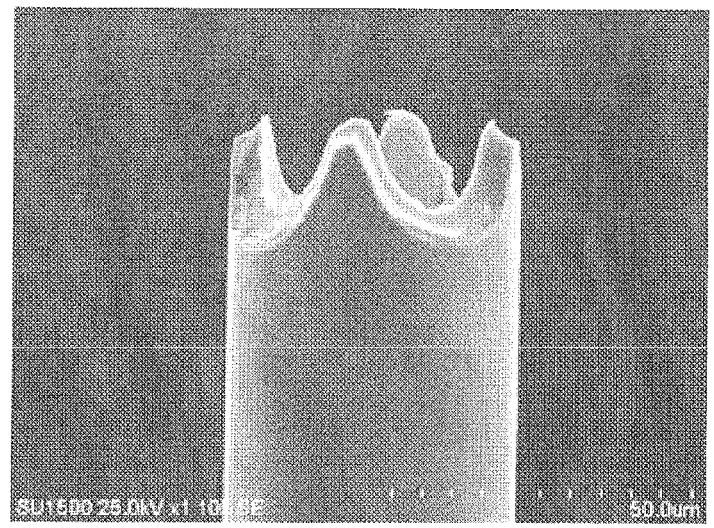
FIG. 13B is a magnified photograph taken by a scanning electron microscope of an abutting part corresponding to the abutting part of the connection terminal of FIGS. 12A and 12B.

FIG. 13B is a magnified photograph taken by a scanning electron microscope and is intended to describe an example in which the abutting part having a shape (hereinafter referred to as "crown shape") that is different from that of FIG. 13A and is shown in FIG. 12A is formed at the end of the nickel-plated layer of the cylindrical body by side etching. The abutting part of the connection terminal shown in this photograph has an outer diameter of about 50 μm, an inner diameter of about 40 μm, and an axial distance of about 5 μm between the edge of the outer wall surface and the edge of the inner wall surface. Further, a distance between the maximum protruding position of the edge of the outer wall surface and the lowest position of the edge of the outer wall surface is about 18 μm, and a distance between the maximum protruding position of the edge of the inner wall surface and the lowest position of the edge of the inner wall surface is about 15 μm. As is apparent from this photograph, the surface between the edge of the outer wall surface and the edge of the inner wall surface is curved.

The connection terminal manufactured using the manufacturing method set forth in the manufacturing method of the present invention is configured so that the end face (side) thereof is curved and inclined from the inner side to the outer side.

In the examples of FIGS. 6A to 6H, the insulating film 76 is formed, and is used as the resist film as needed. In the examples of FIGS. 10A to 13B, since the insulating film is not indispensable, the resist film may be used when etching is carried out.

Further, in the examples of FIGS. 10A to 13B, the abutting part 81a of, for instance, the cylindrical part 81 is described so as to be formed of the single plated layer. However, from the viewpoint of the formation of, for instance, the surface 83 and the contact stability of the target point of the target, for example, the gold-plated layer may not be formed inside the single plated layer, i.e. on the central axis of, for instance, the cylindrical part. However, in this case, the gold-plated layer may be delaminated and not exist around the edge of the inner wall surface of the front end of the abutting part.

For this reason, when the abutting part 81a of, for instance, the cylindrical part 81 is formed by a plurality of plated layers so as to be formed of a nickel-plated layer and a gold-plated layer inside the nickel-plated layer, the edge 82 of the outer wall surface refers to the edge of the outer wall surface of the plated layer formed on the outermost side, and the edge 84 of the inner wall surface refers to the edge of the inner wall surface of the plated layer of the inner side. However, at the front end of the abutting part, when a part of the plated layers is delaminated and does not exist, the edge 84 of the inner wall surface refers to the edge of the inner wall surface of the remaining plated layer of the inner side.

While the embodiments of the connection terminal, the testing jig for testing the specimen, and the probe that allows them to be used according to the invention have been described, the invention is not restricted to these embodiments. It will be understood by those skilled in the art that various additions, omissions, and other modifications in configurations may be made therein without departing from the spirit and scope of the invention. Accordingly, the technical scope of the invention is defined by the scope of the appended claims.

What is claimed is:

1. A connection terminal used for a connection jig interconnecting target points, comprising a small-diameter conductive part and a large-diameter cylindrical part disposed to surround the small-diameter conductive part, wherein
   the small-diameter conductive part has a front end protruding from a front end of the large-diameter cylindrical part,
   the small-diameter conductive part is partly joined to a joint portion that is a part of the large-diameter cylindrical part,
   a cutout part is formed in a part of a strip portion around an axis of the cylindrical part that at least includes the joint portion; and
   at least one portion of the cutout part is positioned on a circumferential surface around an axis of the joint portion of the large-diameter cylindrical part.

2. The connection terminal according to claim 1, wherein the cutout part is made up of a pair of cutout parts that have line symmetry with respect to the axis of the cylindrical part.

3. The connection terminal according to claim 1, wherein the cutout part has a slit shape having an elongated opening.

4. The connection terminal according to claim 1, wherein a spring part is formed at a portion of the cylindrical part which excludes the strip part including the portion joined to the conductive part.

5. The connection terminal according to claim 1, wherein:
   the cutout part has an axial length of the cylindrical part and a widthwise length along a circumferential surface of the strip portion around the axis of the cylindrical part;
   the axial length of the cutout part is a length exceeding axially opposite ends of the cylindrical part of electrodes used when the small-diameter conductive part is partly joined to the part of the large-diameter cylindrical part; or
   the widthwise length of the cutout part is greater than a difference between a circumference of an inner circumferential surface of the cylindrical part and a circumference of an outer circumferential surface of the small-diameter conductive part.

6. The connection terminal according to claim 5, wherein the cutout part is formed in a direction in parallel with the axis of the cylindrical part or a direction intersecting the direction in parallel with the axis.

7. The connection terminal according to claim 1, wherein the small-diameter conductive part is made up of a columnar part or a cylindrical part.

8. The connection terminal according to claim 7, wherein one portion of the conductive part of the small-diameter cylindrical part is a spring part.

9. A method of manufacturing a connection terminal used for a connection jig interconnecting target points, comprising:
   forming a small-diameter conductive part and a large-diameter cylindrical part;
   forming a cutout part in a part of a strip portion around an axis of the large-diameter cylindrical part;
   inserting the small-diameter conductive part into the large-diameter cylindrical part to cause a front end of the small-diameter conductive part to protrude from a front end of the large-diameter cylindrical part;
   disposing a pair of electrodes for resistance welding at positions that are opposite to each other in a direction perpendicular to an axial direction of the strip portion around the axis of the large-diameter cylindrical part and that exclude a position at which the cutout part is formed;
   pressurizing the large-diameter cylindrical part so as to move the pair of electrodes for resistance welding toward each other and bringing the large-diameter cylindrical part into contact with the small-diameter conductive part;
   applying predetermined electric current to the pair of electrodes for resistance welding, thereby joining a part of the large-diameter cylindrical part and a part of the small-diameter conductive part at a joint portion that is a portion of the large-diameter cylindrical part; and
   wherein at least one portion of the cutout part is positioned on a circumferential surface around an axis of the joint portion of the large-diameter cylindrical part.

10. The method according to claim 9, wherein: the cutout part has an axial length of the cylindrical part and a widthwise length along a circumferential surface of the strip portion around the axis of the cylindrical part; the axial length of the cutout part is a length exceeding axially opposite ends of the cylindrical part of electrodes used when the small-diameter conductive part is partly joined to the part of the large-diameter cylindrical part; or the widthwise length of the cutout part is greater than a difference between a circumference of an inner circumferential surface of the cylindrical part and a circumference of an outer circumferential surface of the small-diameter conductive part.

11. The method according to claim 9, wherein the cutout part is formed in a direction in parallel with the axis of the cylindrical part or a direction intersecting the direction in line with the axis.

12. The method according to claim 9, wherein a spring part is formed at a portion of the cylindrical part which excludes the strip part including the portion joined to the conductive part.

13. The method according to claim 9, wherein the small-diameter conductive part is made up of a columnar part or a cylindrical part.

* * * * *